United States Patent
Murakami et al.

(10) Patent No.: US 6,525,718 B1
(45) Date of Patent: Feb. 25, 2003

(54) FLEXIBLE CIRCUIT BOARD AND LIQUID CRYSTAL DISPLAY DEVICE INCORPORATING THE SAME

(75) Inventors: Akira Murakami, Yamatokoriyama (JP); Seiji Maeda, Nara (JP); Shinji Murabe, Nara (JP); Nobuaki Takahashi, Nara (JP); Yoshitsugu Kawahigashi, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/377,568

(22) Filed: Aug. 19, 1999

Related U.S. Application Data

(63) Continuation-in-part of application No. 09/018,499, filed on Feb. 4, 1998, now abandoned.

(30) Foreign Application Priority Data

| Feb. 5, 1997 | (JP) | 9-022306 |
| Sep. 30, 1997 | (JP) | 9-267509 |
| Sep. 28, 1998 | (JP) | 10-274085 |

(51) Int. Cl.[7] ............................................. G09G 5/00
(52) U.S. Cl. .................. 345/206; 345/103; 349/150
(58) Field of Search .................... 345/87–100, 103, 345/204–214; 349/149–152

(56) References Cited

U.S. PATENT DOCUMENTS

| 5,565,885 A | * | 10/1996 | Tamanoi | 345/100 |
| 5,598,283 A | * | 1/1997 | Fujii et al. | 349/143 |
| 5,670,994 A | * | 9/1997 | Kawaguchi et al. | 345/206 |
| 5,731,854 A | * | 3/1998 | Kishida | 349/40 |
| 5,739,887 A | * | 4/1998 | Ueda et al. | 349/149 |
| 5,838,412 A | * | 11/1998 | Ueda et al. | 349/150 |
| 5,893,623 A | * | 4/1999 | Muramatsu | 349/152 |
| 6,104,464 A | * | 8/2000 | Adachi et al. | 349/150 |
| 6,147,739 A | * | 11/2000 | Shibatani | 345/152 |

FOREIGN PATENT DOCUMENTS

| JP | 62 135813 | 6/1987 |
| JP | 64 37533 | 2/1989 |
| JP | 4-20933 | 1/1992 |
| JP | 4-115228 | 4/1992 |
| JP | 4 235530 | 8/1992 |
| JP | 1 47742 | 11/1992 |
| JP | 5-4787 | 1/1993 |
| JP | 8-28395 | 3/1996 |
| JP | 9 44100 | 2/1997 |

* cited by examiner

Primary Examiner—Steven Saras
Assistant Examiner—Amr Awad
(74) Attorney, Agent, or Firm—George W. Neuner; Edwards & Angell LLP

(57) ABSTRACT

A flexible circuit board includes: an insulative tape having a pair of long sides and a pair of short sides; a driving IC mounted on the insulative tape; an input terminal for receiving data signals and control signals to be sent to the driving IC; a first output terminal for outputting a signal from the driving IC; a second output terminal for outputting at least some of the data signals and control signals; and first and second power signal terminals for supplying a voltage to the driving IC, wherein the input terminal, the first output terminal, and the second output terminal are provided on one of the pair of long sides, the first power signal terminal being provided on one of the pair of short sides, and the second power signal terminal being provided on the other one of the pair of short sides.

9 Claims, 26 Drawing Sheets

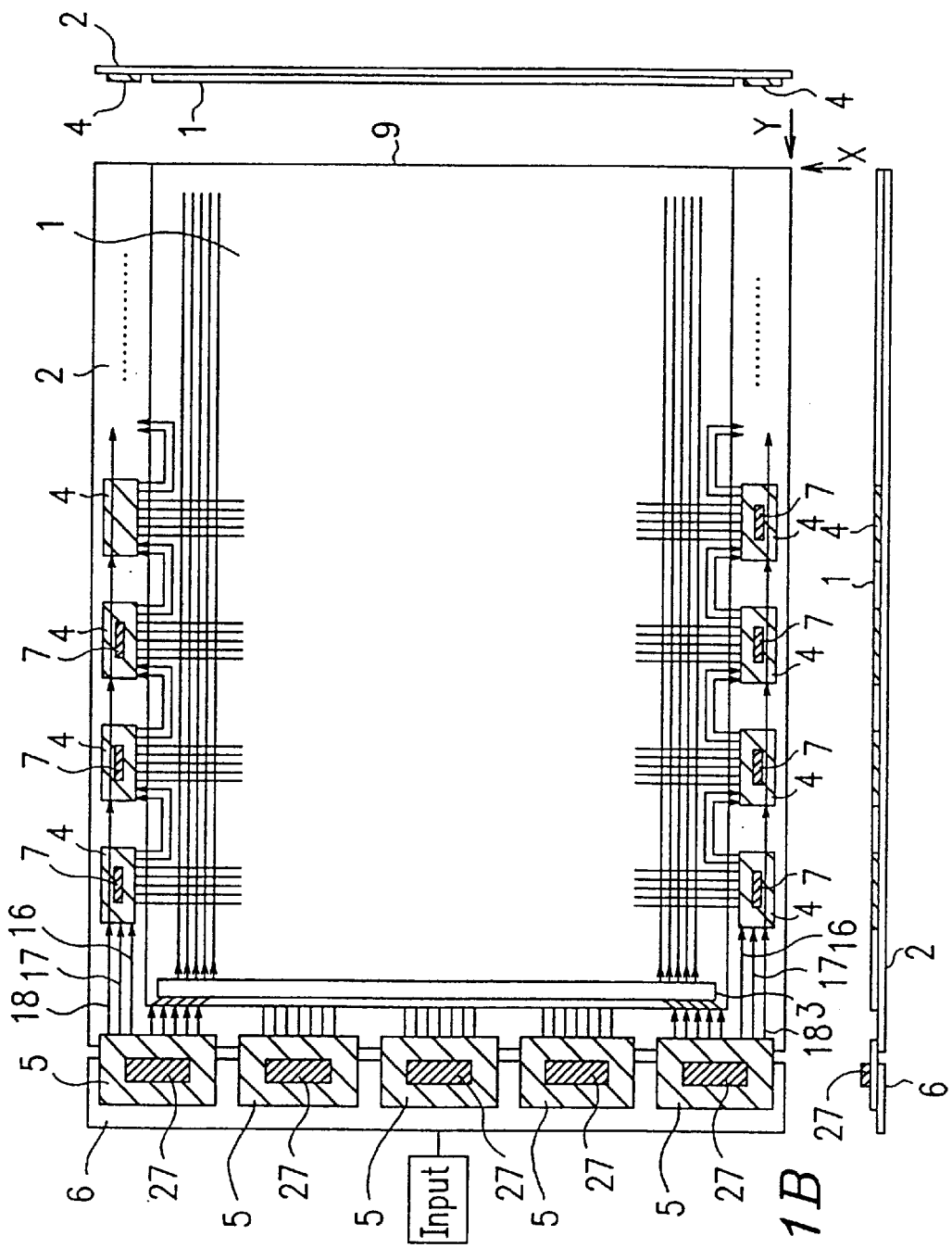

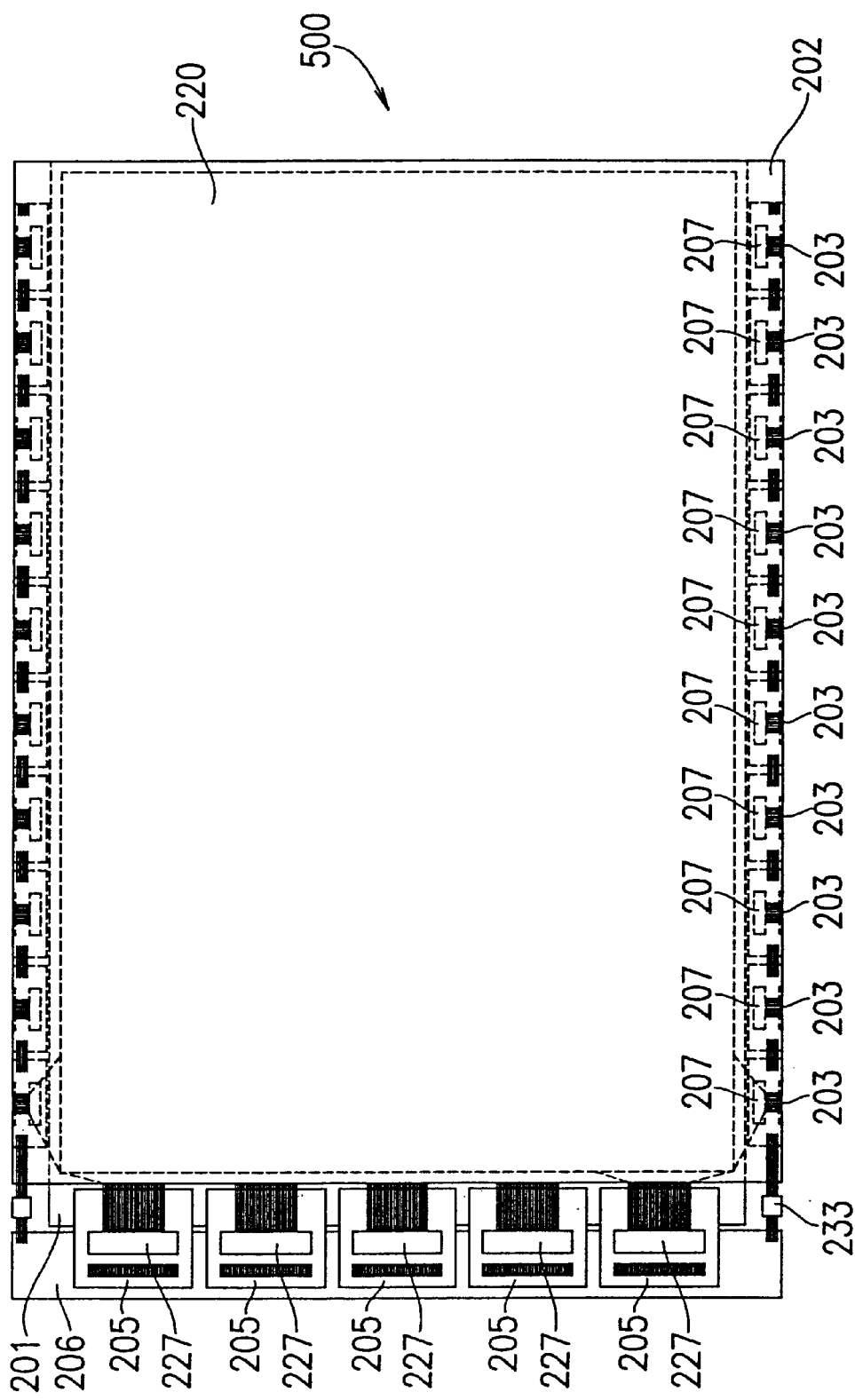

Flat surface 209

Flat surface 209

Wasted space due to wiring leads

*PRIOR ART*

FLEXIBLE CIRCUIT BOARD AND LIQUID CRYSTAL DISPLAY DEVICE INCORPORATING THE SAME

RELATED APPLICATION

This application is a continuation-in-part application of co-pending application Ser. No. 09/018,499 filed on Feb. 4, 1998, now abandoned.

BACKGROUND OF THE INVENTION

1. Field of the Invention

The present invention relates to a liquid crystal display device for use in a display apparatus of an electronic appliance for audi-visual purposes, a display apparatus of an OA (office automation) terminal, an advertisement display, and the like. In particular, the present invention relates to circuit boards (CBs) for supplying signals to a liquid crystal panel.

2. Description of the Related Art

Flexible CBs are used as circuit boards for supplying signals to a liquid crystal (LC) panel of an LC display device. For example, Japanese Laid-open Publication No. 4-115228 and Japanese Publication No. 8-28395 disclose LC display devices incorporating flexible CBs.

Neither of the above-mentioned publications discloses an LC display device in which terminal sections of a data-side glass substrate are provided in a narrow frame-like peripheral region.

SUMMARY OF THE INVENTION

A flexible circuit board according to the present invention includes: an insulative tape having a pair of long sides and a pair of short sides; a driving IC mounted on the insulative tape; an input terminal for receiving data signals and control signals to be sent to the driving IC; a first output terminal for outputting a signal from the driving IC; a second output terminal for outputting at least some of the data signals and control signals; and first and second power signal terminals for supplying a voltage to the driving IC, wherein the input terminal, the first output terminal, and the second output terminal are provided on one of the pair of long sides, the first power signal terminal being provided on one of the pair of short sides, and the second power signal terminal being provided on the other one of the pair of short sides.

In one embodiment of the invention, a notch is provided in the other one of the pair of long sides.

Alternatively, a flexible circuit board according to the present invention includes: an insulative tape having a pair of long sides and a pair of short sides; a driving IC mounted on the insulative tape; an input terminal for receiving a signal used on a data-side flexible circuit board; a first output terminal for outputting a signal from the driving IC; and a second output terminal for outputting the signal used on the data-side flexible circuit board, wherein the first output terminal and the second output terminal are provided on one of the pair of long sides, the input terminal being provided on at least one of the other one of the pair of long sides and inside the insulative tape.

In one embodiment of the invention, the signal used on the data-side flexible circuit board is at least one of a data signal, a control signal, and a power signal.

A liquid crystal display device according to the present invention includes: a scan-side glass substrate; a data-side glass substrate opposing the scan-side glass substrate; liquid crystal interposed between the scan-side glass substrate and the data-side glass substrate; an electrode transition portion provided between the scan-side glass substrate and the data-side glass substrate for transmitting a scanning signal output from the data-side glass substrate to the scan-side glass substrate; and data signal lines, control signal lines, and power signal lines provided on the data-side glass substrate.

Alternatively, a liquid crystal display device according to the present invention includes; a data-side flexible circuit board including: a first insulative tape having a pair of long sides and a pair of short sides; a first driving IC mounted on the first insulative tape; a first input terminal for receiving data signals and control signals to be sent to the first driving IC; a first output terminal for outputting a signal from the first driving IC; a second output terminal for outputting at least some of the data signals and control signals; and first and second power signal terminals for supplying a voltage to the first driving IC, wherein the first input terminal, the first output terminal, and the second output terminal are provided on one of the pair of long sides of the first insulative tape, the first power signal terminal being provided on one of the pair of short sides of the first insulative tape, and the second power signal terminal being provided on the other one of the pair of short sides of the first insulative tape; a scan-side flexible circuit board including: a second insulative tape having a pair of long sides and a pair of short sides; a second driving IC mounted on the second insulative tape; a second input terminal for receiving a signal used on the data-side flexible circuit board; a third output terminal for outputting a signal from the second driving IC; a fourth output terminal for outputting the signal used on the data-side flexible circuit board, wherein the third output terminal and the fourth output terminal are provided on one of the pair of long sides of the second insulative tape, the second input terminal being provided on at least one of the other one of the pair of long sides of the second insulative tape and inside the second insulative tape; a data-side glass substrate coupled to the data-side flexible circuit board and the scan-side flexible circuit board; a scan-side glass substrate opposing the data-side glass substrate; liquid crystal interposed between the scan-side glass substrate and the data-side glass substrate; an electrode transition portion provided between the scan-side glass substrate and the data-side glass substrate for transmitting a scanning signal output from the data-side glass substrate to the scan-side glass substrate; and data signal lines, control signal lines, and power signal lines provided on the data-side glass substrate.

Alternatively, a liquid crystal display device according to the present invention includes; a driving IC; a scan-side glass substrate having a first display driving terminal; a signal-side glass substrate having a second display driving terminal; and an electrode transition portion provided between the scan-side glass substrate and the signal-side glass substrate, wherein the driving IC is coupled to the second display driving terminal of the signal-side glass substrate; and the first display driving terminal of the scan-side glass substrate receives a signal, the signal being supplied to the driving IC via the electrode transition portion and the second display driving terminal.

In one embodiment of the invention, the signal is at least one of a data signal and a control signal.

In another embodiment of the invention, the liquid crystal display device further includes a scan-side printed crystal board for supplying the signal to the first display driving terminal of the scan-side glass substrate.

In still another embodiment of the invention, a seal region is provided in a periphery of the scan-side glass substrate and the signal-side glass substrate, the electrode transition portion being formed in the seal region.

Alternatively, a liquid crystal display device according to the present invention includes: a scan-side glass substrate having a first display driving terminal; a signal-side glass substrate having a second display driving terminal and a line; a first flexible circuit board having a first driving IC; and a second flexible circuit board having a second driving IC, wherein the first flexible circuit board is coupled to the scan-side glass substrate and the second flexible circuit board is coupled to the signal-side glass substrate, the first flexible circuit board being electronically coupled to the second flexible circuit board via an electrode transition portion provided between the scan-side glass substrate and the signal-side glass substrate.

Alternatively, a liquid crystal display device according to the present invention includes; a data-side printed circuit board having a power line; a signal-side glass substrate having a display driving terminal and a line; and a flexible circuit board having a driving IC, an output terminal being formed on one side of the flexible circuit board for outputting a signal to a liquid crystal display panel, and input/output terminals and a power terminal being provided on each of a pair of sides situated at an angle with the one side, wherein the output terminal of the flexible circuit board is electrically coupled to the display driving terminal of the signal-side glass substrate, the input/output terminal of the flexible circuit board being electrically coupled to the line of the signal-side glass substrate, the flexible circuit board having a portion overlapping the data-side printed circuit board, and the flexible circuit board being coupled to the data-side printed circuit board in the overlapping portion in such a manner that the power terminal is electrically coupled to the power line.

In one embodiment of the invention, the liquid crystal display device further includes a scan-side printed circuit board having a power line, the power line of the scan-side printed circuit board being coupled to the power line of the data-side printed circuit board via and FFC cable.

Alternatively, a liquid crystal display device according to the present invention includes: a data-side printed circuit board having a power line for supplying power; a signal-side glass substrate having a display driving terminal and a data-side signal/control signal line; and a flexible circuit board having a driving IC, an output terminal being formed on one side of the flexible circuit board for outputting a signal to a liquid crystal display panel, and input/output terminals and a power terminal being provided on each of a pair of sides situated at an angle with the one side, wherein the power terminal of the flexible circuit board is electrically coupled to the power line of the data-side printed circuit board, the flexible circuit board having a portion overlapping the signal-side glass substrate and, the flexible circuit board being coupled to the signal-side glass substrate in the overlapping portion in such a manner that the output terminal of the flexible circuit board is electrically coupled to the data-side signal/control signal line and the input/output terminal of the flexible circuit board is electrically coupled to the display driving terminal.

In one embodiment of the invention, the signal is a data signal.

In another embodiment of the invention, the signal is a control signal.

In still another embodiment of the invention, the first flexible circuit board is coupled in contact with the scan-side glass substrate on a first contact face, and the second flexible circuit board is coupled in contact with the signal-side glass substrate on a second contact face, the first contact face and the second contact face being interposed between the scan-side glass substrate and the signal-side glass substrate.

Alternatively, a liquid crystal display device according to the present invention includes; a liquid crystal display panel having a display section, the display section including a plurality of signal electrodes and a plurality of opposing scanning electrodes so that the plurality of signal electrodes and the plurality of opposing scanning electrodes together compose a matrix; at least one data-side flexible circuit board, each including; a driving IC for generating a scanning signal; and an output terminal for supplying the display signal to the plurality of signal electrodes; and a scan-side flexible circuit board for supplying a scanning signal for the plurality of scanning electrodes, wherein the driving IC is located between the display section and the output terminal of the data-side flexible circuit board.

In one embodiment of the invention, the output terminal is provided on one face of the at least one data-side flexible circuit board, and the at least one data-side flexible circuit board further includes, on the face on which the output terminal is provided, input/output terminals for inputting or outputting a signal to or from the driving IC.

In another embodiment of the invention, the at least one data-side flexible circuit board further includes input/output terminals for inputting or outputting a signal to or from the driving IC, and the output terminal of the at least one data-side flexible circuit board is located in a region surrounded by the input/output terminals and the driving IC.

In still another embodiment of the invention, the at least one data-side flexible circuit board includes notches at a side along which the output terminal is provided.

In still another embodiment of the invention, the driving IC on the at least one data-side flexible circuit board is coated with resin so that the resin does not substantially project from the surface of an insulation film provided on a back face of the data-side flexible circuit board.

In still another embodiment of the invention, an input terminal inputting signal to the liquid crystal display panel and a portion of a wiring lead coupled to the input terminal are provided on the liquid crystal display panel.

In still another embodiment of the invention, adjoining ones of the at least one data-side flexible circuit board are interconnected via a bridging circuit board.

Thus, in a flexible circuit board according to the present invention, input terminals for receiving data signals and control signals to be sent to a driving IC, a first output terminal for outputting a signal from the driving IC; and a second output terminal for outputting all or some of the data signals and control signals are provided in one line along one of the long sides of the flexible circuit board. As a result, all of these terminals can be simultaneously coupled to terminals on a data-side glass substrate. Since most of these terminals are provided on the long side of the flexible circuit board, the number of terminals provided on a short side of the flexible circuit board is reduced accordingly, thereby making it possible to reduce the dimension of the short sides of the flexible circuit board.

The construction according to the present invention also facilitates a pressure-attachment process. In particular, the adjustment in terms of press tool balance is facilitated. Herein, the term "press tool balance" is defined as a balance between a tool for pressure-attaching substrates together and the substrates to be thus attached. A good "press tool balance" generally illustrates a state where such a tool is in uniform contact with the substrates to be attached. For example, a poor "press tool balance" in a press-attachment or soldering situation may emerge in the case where pressure-attachment occur in dispersed positions.

Furthermore according to the present invention, in the case where a plurality of said flexible circuit boards are employed so that the flexible circuit boards are disposed on a periphery of a data-side glass substrate, it is possible to utilize a terminal on the data-side glass substrate (which corresponds and is coupled to an input terminal and an output terminal of the flexible circuit board) as part of the wiring for transmitting signals to an adjoining flexible circuit board. As a result, a portion of a terminal on the data-side glass substrate may be utilized as part of the wiring for electrically coupling the input terminal and/or the output terminal of a flexible circuit board to those of an adjoining flexible circuit board, with the terminals of the adjoining flexible circuit boards being coupled by straight lines, for example. This helps eliminate redundant regions on the data-side glass substrate extending along the short side direction of the flexible circuit board.

Since the input/output terminals of data signals and control signals are provided along a long side of the flexible circuit board, it is possible to reduce the area for junction between an output terminal on a short side of a flexible circuit board of a liquid crystal display panel and an input terminal on a short side of an adjoining flexible circuit board. As a result, the frame-like peripheral region of the LC display device can be effectively narrowed.

In another embodiment of the present invention, the flexible circuit board may have notches along the other long side. This makes it possible to confirm the state of attachment between the flexible circuit board and the data-side glass substrate by eyesight.

A flexible circuit board according to a further embodiment of the present invention includes first output terminals for outputting signals from the driving IC, and second output terminals for outputting the signals used on the data-side flexible circuit board, the first and second output terminals being provided along one of a pair of long sides of the flexible circuit board. As a result, the frame-like peripheral region of a data-side glass substrate for coupling the flexible circuit board with the data-side glass substrate can be made narrow.

In a liquid crystal display device according to the present invention, an electrode transition portion for scanning signal lines is provided between a scan-side glass substrate and a data-side glass substrate, so that a scanning signal input from the data-side glass substrate can be supplied to the scanning signal lines on the scan-side glass substrate via the electrode transition portion. This eliminates the need for coupling the scan-side glass substrate with the data-side glass substrate by the use of jumper leads or the like. As a result, the wiring design for the data signal lines, control signal lines, the power signal lines, and the like is simplified, thereby facilitating the overall design process for the liquid crystal display device of the present invention.

In the case where the data-side flexible circuit boards and the scan-side flexible circuit boards are oriented in the same direction, it is possible to simultaneously press-attach such flexible circuit boards, and to simultaneously apply a moisture-resistant material on the wiring.

In the case where the data-side flexible circuit board is disposed so as to fit within the data-side glass substrate, it becomes possible to reduce circuit boards and hence the manufacturing cost, improve the reliability (in terms of likelihood of disruption of lines connected to input and/or output terminals), and improve vibration resistance.

In the case where the data-side flexible circuit boards or the scan-side flexible output boards are press-attached onto the data-side glass substrate by means of an anisotropic conductive film, it is possible to conveniently peel the data-side or scan side flexible circuit board. This will facilitate the repair of the liquid crystal display device.

Thus, the invention described herein makes possible the advantage of providing an be LC display device in which terminal sections of a data-side glass substrate are provided in a narrow frame-like peripheral region.

This and other advantages of the present invention will become apparent to those skilled in the art upon reading and understanding the following detailed description with reference to the accompanying figures.

BRIEF DESCRIPTION OF THE DRAWINGS

FIG. 1A is a front view of an LC display device according to an example of the present invention.

FIG. 1B is a side view of the LC display device in FIG. 1A as seen from the direction denoted as X.

FIG. 1C is a side view of the LC display device in FIG. 1A as seen from the direction denoted as Y.

FIG. 28 is a front view of still another LC display device 500 according to Example 4 of the present invention.

DESCRIPTION OF THE PREFERRED EMBODIMENTS

Figures 2A, 2B:
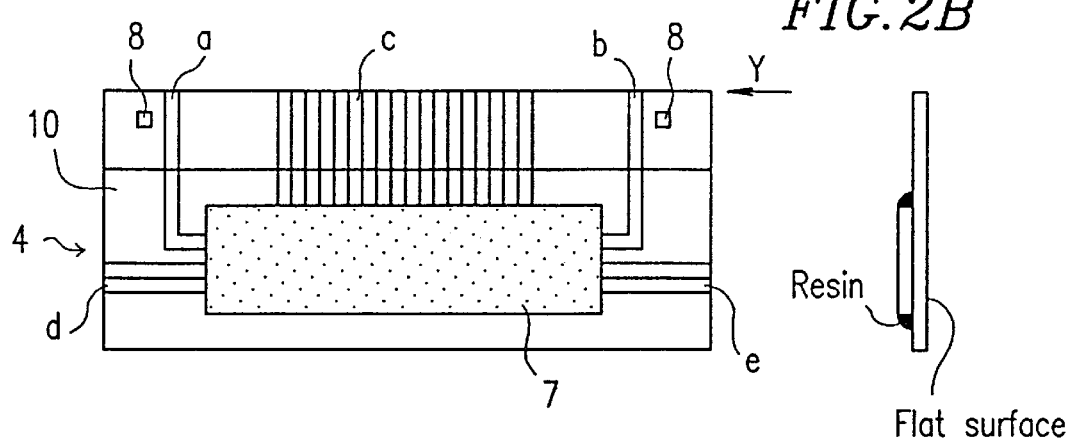
FIG. 2A is a front view of a data-side flexible CB.
FIG. 2B is a side view of the data-side flexible CB in FIG. 2A as seen from the direction denoted as Y.

Hereinafter, the present invention will be described by way of examples, with reference to the accompanying figures.

EXAMPLE 1

FIGS. 1A, 1B, and 1C illustrate the configuration of an LC display device according to an example of the present invention. FIG. 1A is a front view of the LC display device; FIG. 1B is a side view of the LC display device as seen from the direction denoted as X; FIG. 1C is a side view of the LC display device as seen from the direction denoted as Y.

The LC display device of the present example includes: an LC display panel 9 having a scan-side glass substrate 1 and a data-side glass substrate 2; an electrode transition portion 3; a plurality of data-side flexible CBs 4 which are cascade coupled to one another; a plurality of scan-side flexible CBs 5; a scan-side printed CB 6; lines 16 for conveying data signals; lines 17 for conveying control signals; and lines 18 for conveying signals from a power source. Each data-side flexible CB 4 has a driving IC (integrated circuit) 7 provided thereon. Each scan-side flexible CB 5 has a driving IC 27 provided thereon.

The data-side glass substrate 2 of the LC display panel 9 is electrically coupled to the scan-side printed CB 6 via the scan-side flexible CBs 5. The data-side flexible CBs 4 are provided on the data-side glass substrate 2.

The scan-side printed CB 6 receives data signals, control signals, and power signals from outside. The data signals, control signals, and power signals from outside. The data signals, control signals, and power signals are input to each scan-side flexible CB 5 via the scan-side printed CB 6.

The driving IC 27 provided on each scan-side flexible CB 5 processes the data signals in accordance with the control signals so as to generate scan-side output signals. The power signals are fed to the driving ICs 27. The scan-side output signals are input to the scan-side glass substrate 1 via the electrode transition portion 3.

All or some of the data signals, control signals, and power signals supplied to the scan-side flexible CB 5 are output from each scan-side flexible CB 5 to the data-side flexible CB 4. All or some of the scan-side output signals generated by the driving ICs 27 may be output from each scan-side flexible CB 5 to the data-side flexible CB 4.

All or some of the data signals, control signals, and power signals sent from each scan-side flexible CB 5 to the data-side flexible CBs 4 are sequentially transmitted to other data-side flexible CBs 4 via the data-side glass substrate 2. The driving ICs 7 on the data-side flexible CBs 4 process the data signals in accordance with the control signals so as to generate driving signals.

For achieving the transfer of the driving signals from one data-side flexible CB 4 to an adjoining data-side flexible CB 4, U-shaped lines and/or straight lines may be provided on the data-side glass substrate 2. The use of such U-shaped lines and/or straight lines for transferring the driving signals from one data-side flexible CB 4 to an adjoining data-side flexible CB 4 eliminates the need to secure extra wiring regions on each data-side flexible CB 4.

In FIG. 1A, the lines 16 (for conveying data signals), the lines 17 (for conveying control signals), and the lines 18 (for conveying power signals) are shown with arrows that indicate the respective directions of flow of the data signals, the control signals, and the power signals. As indicated by the arrows in FIG. 1A, the control signals are sequentially transmitted from one data-side flexible CB 4 to another via the lines 17 (note that the data-side flexible CB 4 are cascade coupled to one another). Similarly, the data signals and the power signals are sequentially transmitted from one data-side flexible CB 4 to another.

FIGS. 2A and 2B illustrate an exemplary configuration of each data-side flexible CB 4. FIG. 2A is a front view of the data-side flexible CB 4; and FIG. 2B is a side view of the data-side flexible CB 4 of FIG. 2A as seen from the direction denoted as Y.

The data-side flexible CB 4 shown in FIG. 2A includes: a driving IC 7; a substrate 10, input terminals a for receiving data signals and control signals; output terminals b for outputting all or some of the received data signals and control signals; output terminals c for outputting the driving signals generated by the driving IC 7 in accordance with the data signals and the control signals; and first and second power terminals d and e for supplying a voltage to the driving IC 7.

The substrate 10 has a pair of relatively long sides (hereinafter referred to as the "long sides") and a pair of relatively short sides (hereinafter referred to as the "short sides". The substrate 10 also has positioning marks (register marks) 8 on its surface. By aligning the register marks 8 on the substrate 10 with the register marks 8' on the data-side glass substrate 2 (as described later), it becomes possible to easily position the data-side flexible CB 4 with respect to the data-side glass substrate 2, or vice versa. As shown in FIG. 2A, input terminals a, output terminals b, and output terminals c are provided on one of the long sides of the substrate 10. As a result, the terminal sections of the data-side glass substrate 2 can be provided in a narrow frame-like peripheral region. The substrate 10 is preferably a flexible substrate. The terminal sections of the data-side glass substrate 2 are defined as a medium for transferring data or the like from the scan-side printed CB 6 to the data-side glass substrate 2.

As shown in FIG. 2B, the driving ICs 7 are coupled to the substrate 10 with resin. The face of the substrate 10 opposite to the face on which the driving IC 7 is provided is made flat. As a result, the data-side flexible CB 4 can be easily attached to the data-side glass substrate 2 by pressure, etc.

Figures 3A, 3B:
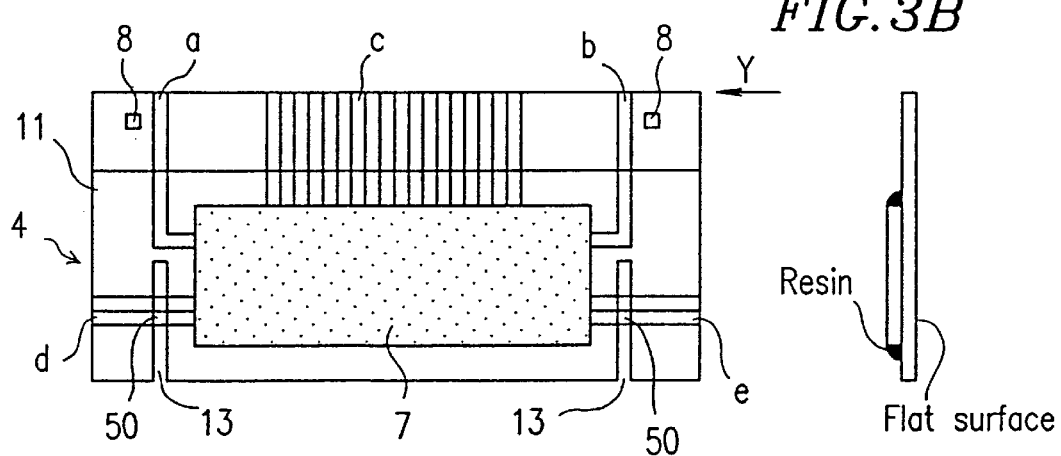
FIG. 3A is a front view of a data-side flexible CB.
FIG. 3B is a side view of the data-side flexible CB in FIG. 3A as seen from the direction denoted as Y.

FIGS. 3A and 3B illustrate another exemplary configuration of each data-side flexible CB 4. FIG. 3A is a front view of the data-side flexible CB 4; and FIG. 3B is a side view of the data-side flexible CB 4 of FIG. 3A as seen from the direction denoted as Y.

As shown in FIG. 3A, the data-side flexible CB 4 is based on a substrate 11 having notches 13. Otherwise the data-side flexible CB 4 of FIG. 3A has the same structure as that of the data-side flexible CB 4 of FIG. 2A. The notches 13 are provided on the long side of the substrate 11 opposite the long side along which input terminals a, output terminals b, and output terminals c are provided. Lines 50 are extended astride the notches 13 on the face of the data-side flexible CB 4 opposite the face bearing the driving IC 7.

By utilizing the notches 13 of the data-side flexible CB 4, it is possible to confirm the state of attachment between the data-side glass substrate 2 and the data-side flexible CB 4 by eyesight. Specifically, by means of a scope or the like, the state of attachment not only around the long side and the short side of the data-side flexible CB 4 but also inside the data-side flexible CB 4 can be confirmed through the notches 13.

If the data-side flexible CB 4 is to be press-attached onto a surface which has some convexities and concavities, the notches 13 of the data-side flexible CB 4 will absorb the expansion/shrinkage of the data-side flexible CB 4 due to such unevenness of the surface, allowing the data-side flexible CB 4 to be flexibly pressed onto the surface.

Furthermore, the slight expansion of the data-side flexible CB 4 occurring when it is attached to a surface through thermal adhesion will also be absorbed by the notches 13, thereby allowing the data-side flexible CB 4 to be flexibly pressed onto the surface.

The data-side flexible CB 4 shown in FIGS. 2A and 3A can have a switch (not shown) for switching the internal wiring in the substrate 10 or 11. For example, when an input terminal a is coupled to a first line and an output terminal b is coupled to a second line, the switch may be operated so as to couple the input terminal a to the second line and the output terminal b to the first line. Similarly, when first power terminal d is coupled to a third line and second power terminal e is coupled to a fourth line, the switch may be operated so as to couple first power terminal d to the fourth line and the second power terminal e to the third line.

In an application where such a switch is incorporated in the data-side flexible CB 4, it is possible to properly operate the LC display device according to the present example in the case where the data-side flexible CB 4 is attached to the data-side glass substrate 2 in an inverse position, e.g., upside down or right to left, by properly operating the switch.

Figures 4A, 4B:
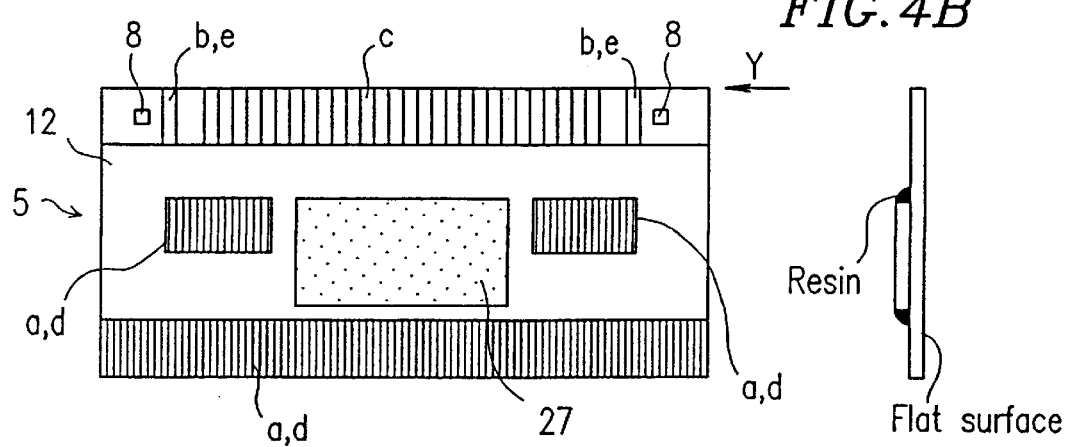
FIG. 4A is a front view of a scan-side flexible CB.
FIG. 4B is a side view of the scan-side flexible CB in FIG. 4A as seen from the direction denoted as Y.

FIGS. 4A and 4B illustrate an exemplary configuration of each scan-side flexible CB 5. FIG. 4A is a front view of the scan-side flexible CB 5; and FIG. 4B is a side view of the scan-side flexible CB 5 of FIG. 4A as seen from the direction denoted as Y.

The scan-side flexible CB 5 shown in FIG. 4A includes a driving IC 27; a substrate 12, input terminals a for receiving data signals and control signals; output terminals b for outputting all or some of the received data signals and control signals; output terminals c for outputting the driving signals generated by the driving IC 27 in accordance with the data signals and the control signals; and first and second power terminals d and e for supplying a voltage to the driving IC 7.

The substrate 12 has a pair of long sides and a pair of short sides. The substrate 12 also has positioning marks (register marks) 8 on its surface.

Input terminals a and first power terminal d are disposed on one of the long sides of the substrate 12 and/or inside the substrate 12. Output terminals b, output terminals c, second power terminals e are disposed on the other long side of the substrate 12.

Figure 5:
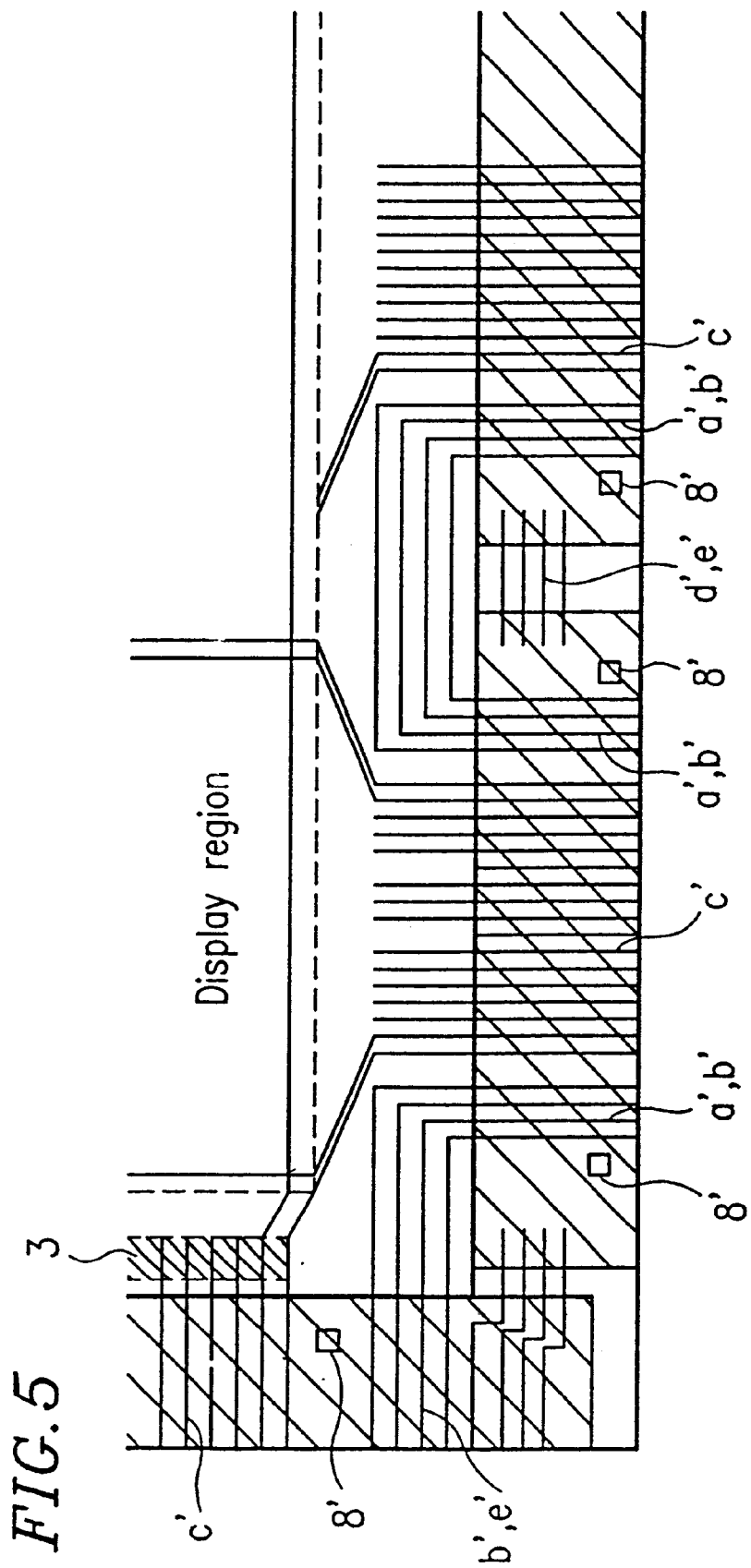
FIG. 5 is a partial view illustrating the details of a data-side glass substrate 2.

FIG. 5 is a diagram showing the details of a portion of the data-side glass substrate 2. As shown in FIG. 5, the data-side glass substrate 2 has register marks 8', terminals a', b', c', d', and e'. The terminals a', b', c', d', and e' are electronically coupled to input terminals a, output terminals b, output terminals c, first power terminal d, and second power terminal e of the data-side flexible CB 4 and/or the scan-side data-side 5.

The register marks 8' are used for positioning the scan-side flexible CBs 4 and the data-side flexible CBs 5 relative to the data-side glass substrate 2. The hatched portions in FIG. 5 represent portions of the data-side glass substrate 2 which overlap the scan-side flexible CBs 4 and the data-side flexible CBs 5.

Figure 6:
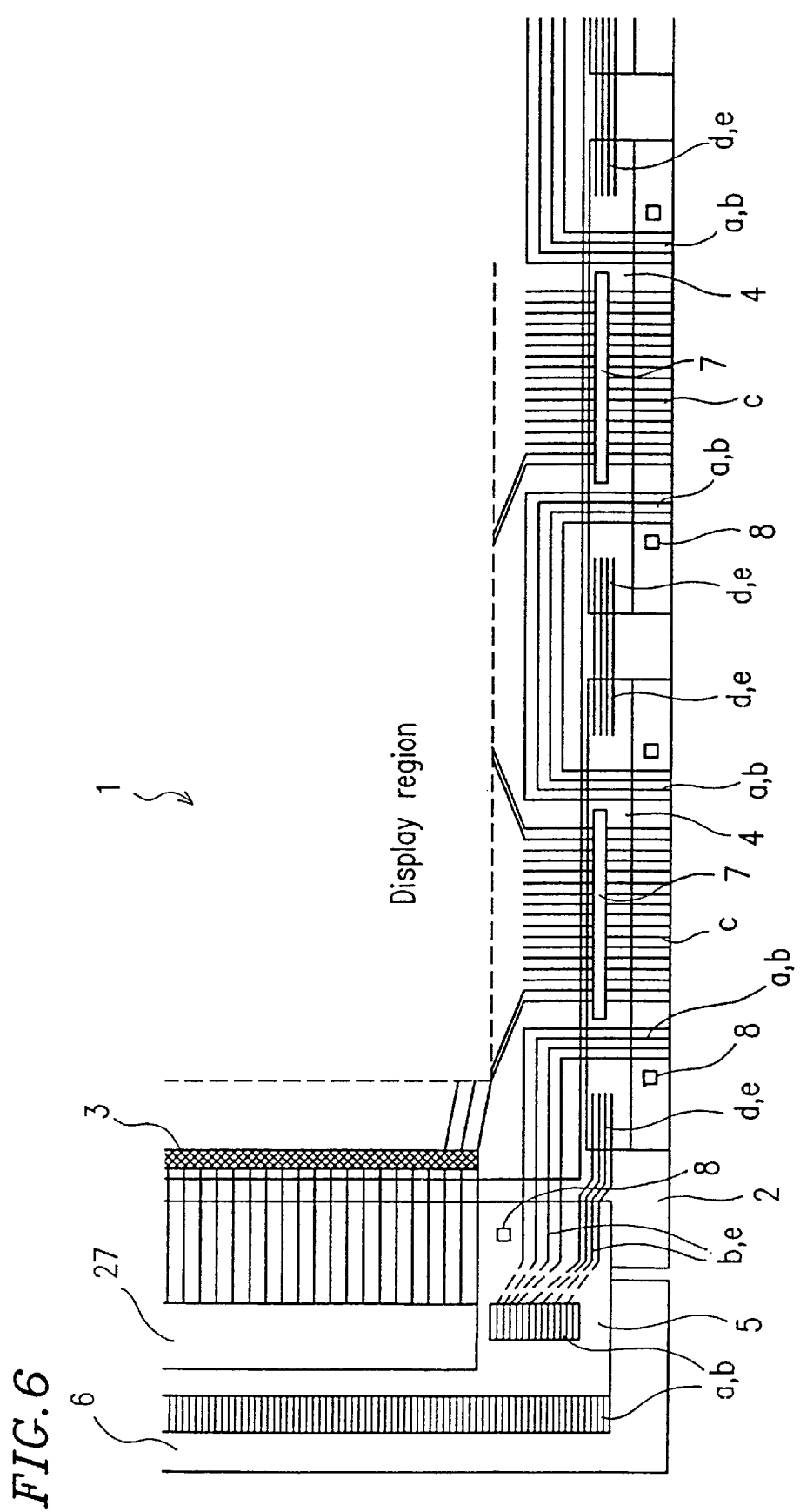
FIG. 6 illustrates an LC display device in which an electrode transition portion, a scan-side flexible CBs, and a data-side flexible CBs are mounted on a data-side glass substrate according to the present invention.

FIG. 6 illustrates an LC display device in which the electrode transition portion 3, the scan-side flexible CBs 5, and the data-side flexible CBs 4 are mounted on the data-side glass substrate 2 according to the present invention. The scan-side flexible CBs 5 and the data-side flexible CBs 4 are press-attached to the data-side glass substrate 2 via an anisotropic conductive film or the like (not shown). The scan-side flexible CBs 5 are soldered to the scan-side printed CB 6.

Figure 7:
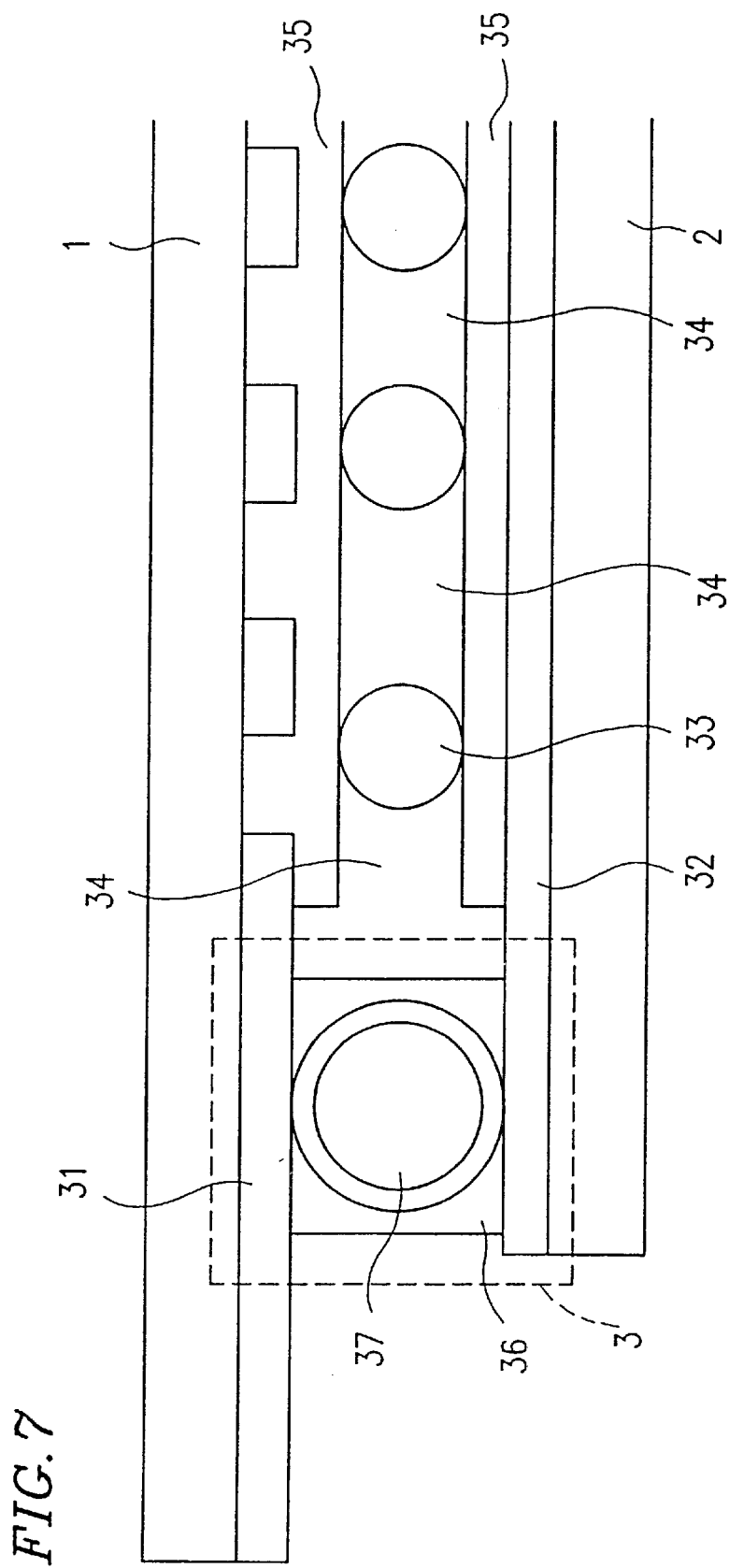
FIG. 7 is a schematic diagram illustrating a structure of an electrode transition portion.

FIG. 7 is a schematic diagram illustrating the structure of the electrode transition portion 3. The LC display device of FIG. 7 includes the scan-side glass substrate 1, the data-side glass substrate 2, scanning electrodes 31 (there is only one shown), signal electrodes 32 (there is only one shown), spacers 33, liquid crystal 34, alignment films 35, seal 36, and conductive particles 37 (there is only one shown).

The electrode transition portion 3 has a structure in which the scanning electrode 31 is electrically coupled to the signal electrode 32 via the conductive particle 37 (having a diameter which is substantially equal to the thickness of the LC layer 34) between the scan-side glass substrate 1 and the data-side glass substrate 2.

The conductive particles 37 are formed by coating a highly conductive metal layer (e.g., Au) on flexible non-conductive particles (e.g., plastics) by plating or the like. The conductive particles 37 are dispersed in sealing resin, so that the electrode transition portion 3 is made concurrently with the forming of the sealing resin.

In accordance with the above-described structure, scanning signals are allowed to be transferred from the data-side glass substrate 2 to the scan-side glass substrate 1. The relative positions of the scan-side glass substrate 1 and the data-side glass substrate 2 may be reversed with respect to what is illustrated in FIG. 7 so long as the transfer of the scanning signals from data-side glass substrate 2 to the scan-side glass substrate 1 occurs.

EXAMPLE 2

Figure 8:
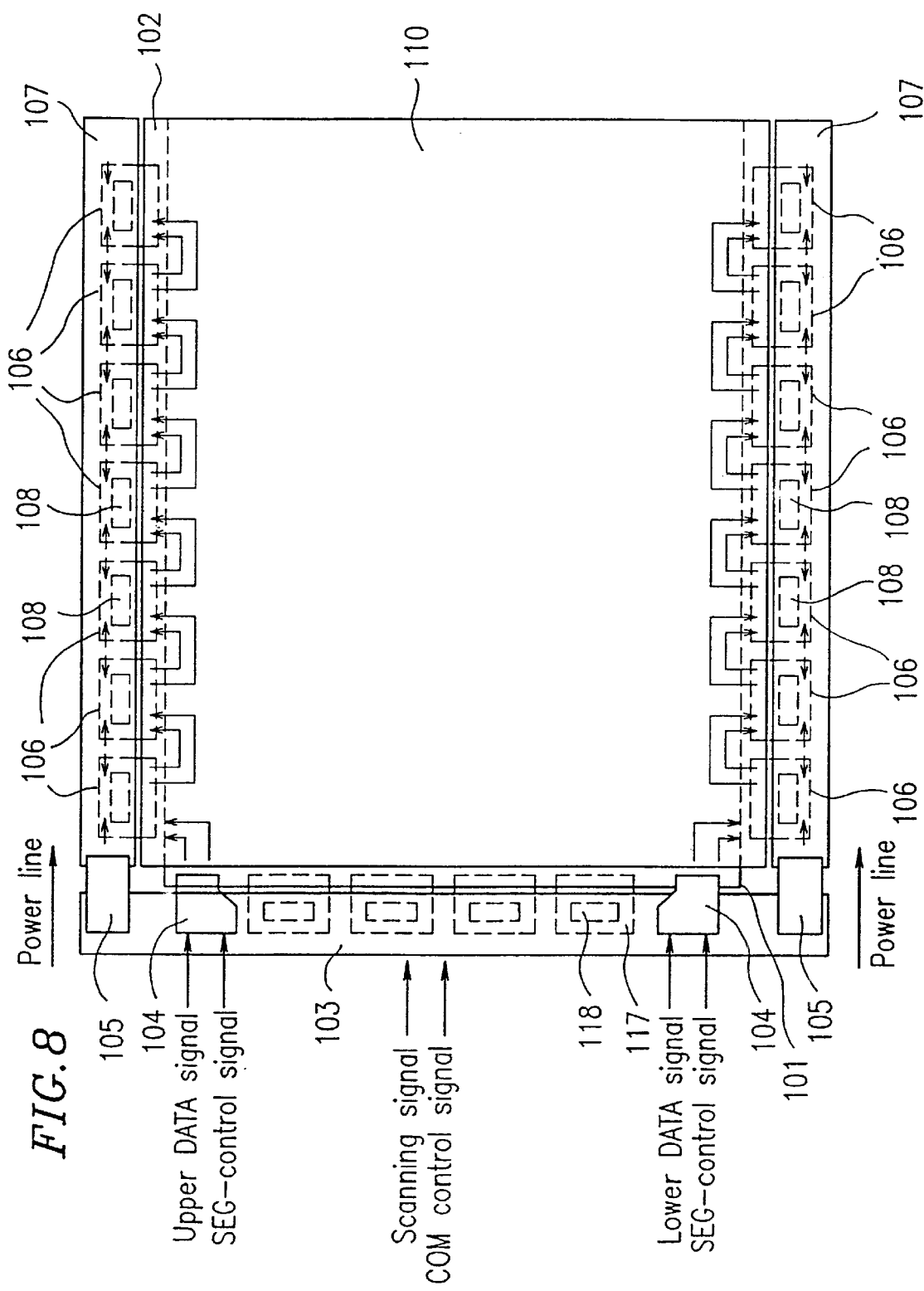
FIG. 8 is a plan view illustrating a configuration of an LC display device according to a second example of the present invention.

FIG. 8 is a plan view illustrating the configuration of an LC display device according to a second example of the present invention.

The LC display device shown in FIG. 8 includes: an LC display panel 110 having a scan-side glass substrate 101 and a signal-side glass substrate 102; data-side flexible CBs 106 on which driving ICs 108 are mounted; scan-side flexible CBs 117 on which driving ICs 118 are mounted; a scan-side printed CB 103; and a data-side printed CB 107. The scan-side glass substrate 101 and the signal-side glass substrate 102 are attached to each other in a peripheral seal region, thereby forming an LC cell with liquid crystal injected therebetween.

In FIG. 8, the scan-side printed CB 103 is electrically coupled to the scan-side glass substrate 101 of the LC display panel 110 via flexible printed CBs (FPC) 104.

The scan-side printed CB 103 includes a plurality of input terminals for receiving data signals and control signals. The scan-side printed CB 103 also includes a plurality of lines from the plurality of input terminals extending to the FPCs 104.

The data signals and/or control signals input to at least one of the input terminals of the scan-side printed CB 103 are input to the scan-side glass substrate 101 via the FPCs 104. The data signals and/or control signals flow from the scan-side glass substrate 101 (through an electrode transition portion formed in a non-display region within the LC display panel, e.g., a corner of the LC display panel) into the signal lines on the signal-side glass substrate 102. The data signals and/or control signals are sequentially input to the respective flexible CBs 106 via the signal lines formed on the signal-side glass substrate 102.

The arrows in FIG. 8 indicate the directions of flow of the data signals and/or control signals, or the directions in which power voltages are supplied in the power voltage lines.

The signal-side glass substrate 102 includes terminals for driving the display (hereinafter referred to as "display driving terminals"), which are coupled to the data signal lines of the signal-side glass substrate 102. The display driving terminals of the signal-side glass substrate 102 are coupled to the output terminals of the data-side flexible CBs 106.

The flexible CBs 106 are cascade coupled to one another. Adjoining flexible CBs 106 are electrically coupled via signal lines formed on the signal-side glass substrate 102 so that the signals are sequentially transmitted between adjoining flexible CBs 106 via the signal lines.

The flexible CBs 106 are disposed below the data-side printed CB 107. The flexible CBs 106 have power voltage lines and input terminals. The power voltage lines are coupled to the input terminals. Power voltage lines are also formed on the data-side printed CB 107. The input terminals of the flexible CBs 106 are coupled to the power voltages lines of the data-side printed CB 107 whereby power voltages are supplied to the flexible CBs 106.

The data-side printed CB 107 is coupled to the scan-side printed CB 103 via FFCs 105. The power voltage lines of the scan-side printed CB 103 are electrically coupled to the power voltage lines of the data-side printed CB 107 via the FFCs 105. In the LC display device of FIG. 8, the driving ICs 108 for the data-side are provided on the upper end and lower end of the device, whereas the driving ICs 118 for the scan-side are provided only on the left end of the device.

Figure 9:
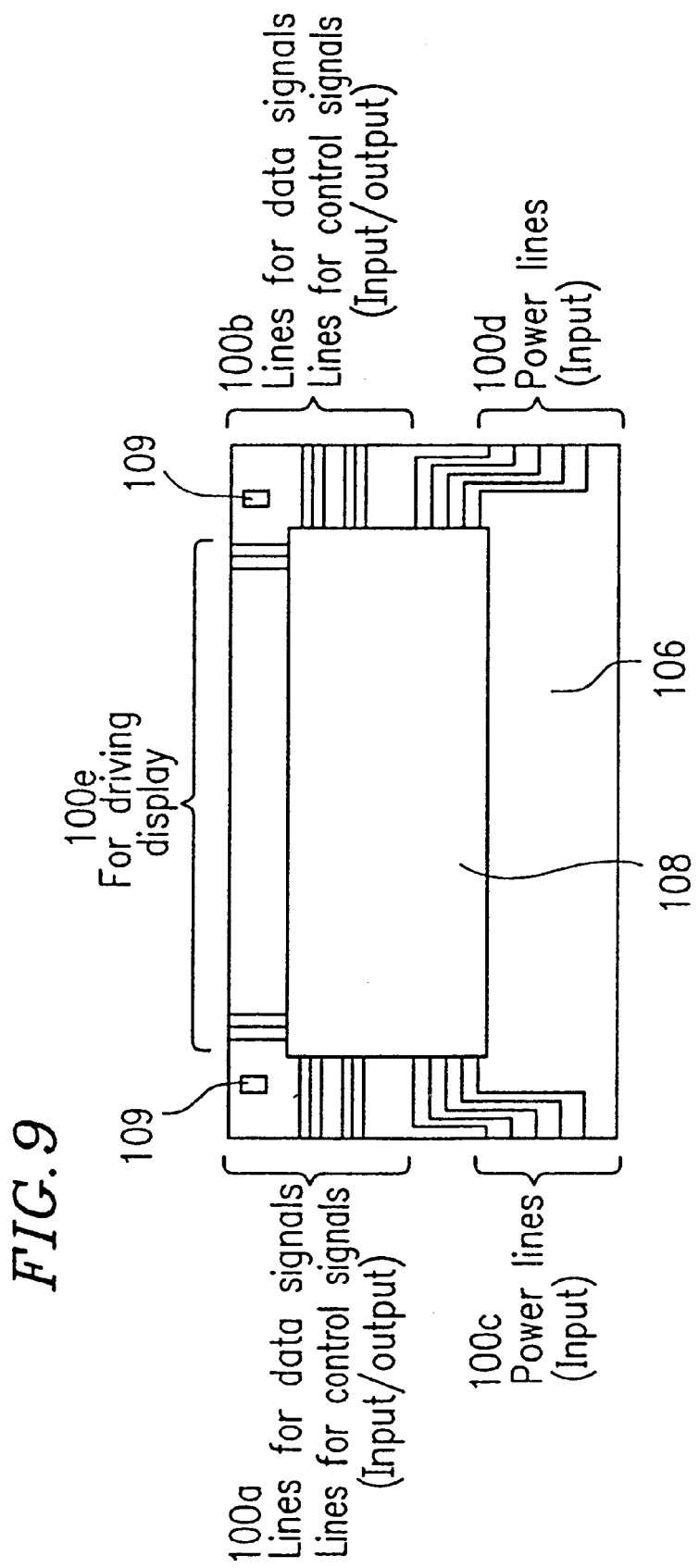
FIG. 9 is a detailed plan view illustrating a flexible CB.

FIG. 9 is a detailed plan view illustrating each flexible CB 106 employed in Example 2. The data-side driving IC 108 is mounted substantially in the center of the flexible CB 106. The data-side driving IC 108 is coupled to the wiring of the flexible CB 106 via wire bonding. Input/output terminals 100a and 100b (including about 8–12 data signal lines and about 4 control signal lines for control signals such as LP, XCK, M, DISP) are provided in the upper left side and upper right side of the flexible CB 106, respectively. Power voltage lines (as well as input terminals coupled to the power voltage lines 100c and 100d, respectively) are provided in the lower left side and the lower right side of the flexible CB 106, respectively.

Furthermore, in the upper side of the flexible CB 106, about several dozen output lines of the driving IC 108 as well as output terminals a coupled to the output lines are provided. It will be appreciated that, the flexible CB 106 has a configuration of right-left symmetry with respect to the shape, lines, and terminals. As a result, signals may be either output or input at the input/output terminals 100a and 100b corresponding to the data signal lines and the control signal lines. In other words, signals may flow from the right side to the left side, or vice versa, of the flexible CB 106.

Thus, the flexible CB 106 according to the present example can be mounted on either the lower end or upper end of a surface of the signal-side glass substrate 102. The flexible CB 106 can even be mounted in a inverse position.

Figure 10:
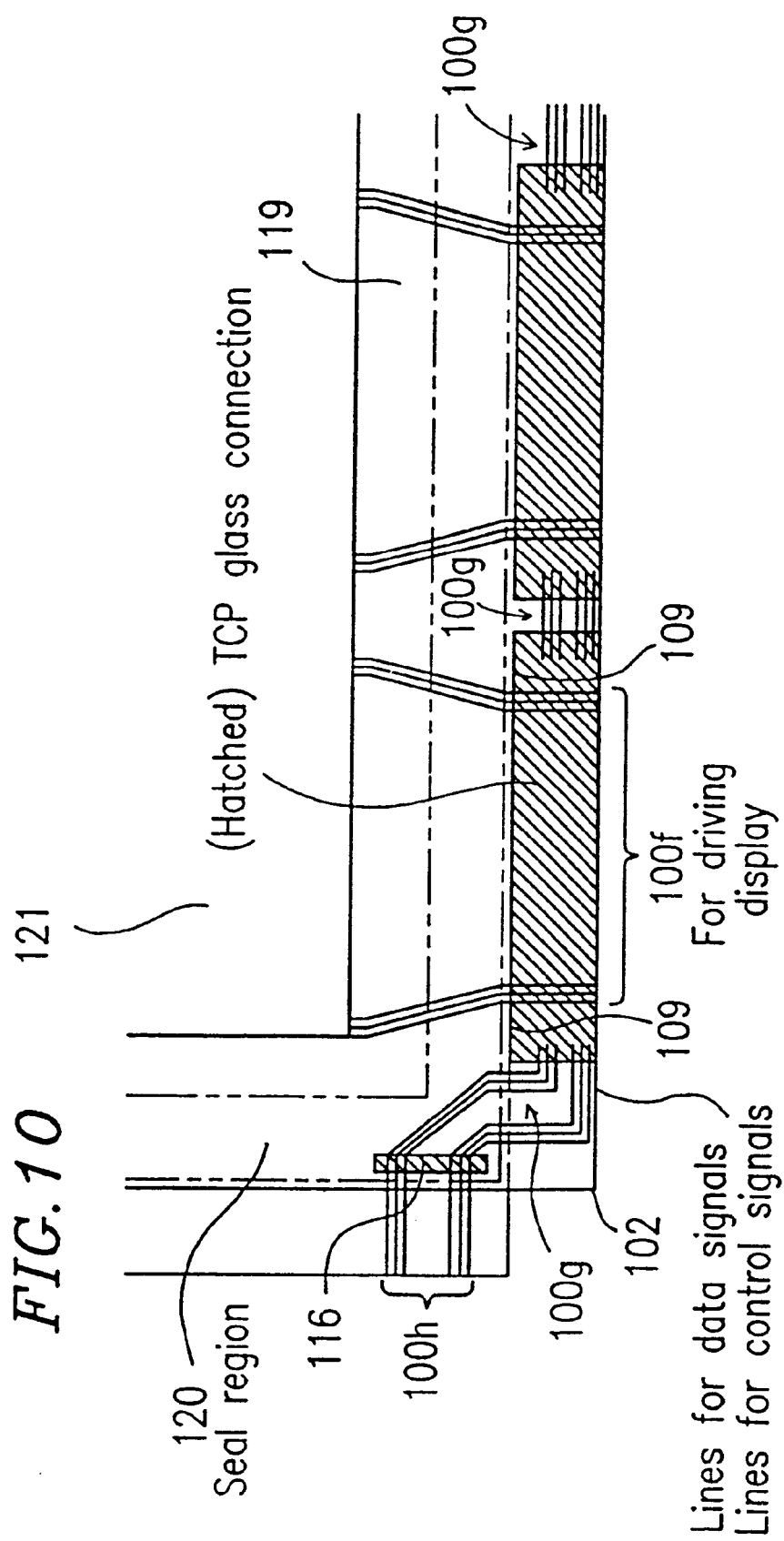
FIG. 10 is a plan view illustrating a signal-side glass substrate and a portion of a scan-side glass substrate in its vicinity.

FIG. 10 is a plan view illustrating a signal-side glass substrate 102 employed in the present example and a portion of the scan-side glass substrate 101 in its vicinity. The scan-side glass substrate 101 and the signal-side glass substrate 102 are attached to each other in a peripheral seal region, thereby forming an LC cell with liquid crystal injected therebetween. The LC cell (including a display region 121) is defined as the interspace between the scan-side substrate 101 and the signal-side glass substrate 102.

The data signal lines (not shown) disposed in the display region 121 are coupled to display driving terminals 100f (width: approximately 2 mm) via leads 119. The display driving terminals 100f are shown to be provided at an end of the signal-side glass substrate 102. In the display region 121, the leads 119 are provided at gradually tapered intervals so that several hundred to several dozen data signal lines (provided at an interval of several hundred to several dozen μm) can be coupled to the corresponding display driving terminals 100f (provided at an interval of several dozen μm).

On the signal-side glass substrate 102, signal lines 100g to be coupled to the input/output terminals 100a and 100b of the data signal lines and control signal lines of adjoining flexible CBs 106 are formed between regions where the display driving terminals 100f are formed.

Concurrently with the formation of the data signal lines, leads 119, and the display driving terminals 100f, preferably, the signal lines 100g are also formed from the same material. In the present example, the signal lines 100g are formed of a conductive material such as ITO (indium tin oxide).

With the display driving terminals 100f being aligned with output terminals 100e of the flexible CBs 106, and the signal lines 100g being aligned with the input/output terminals 100a and 100b, all the flexible CBs 106 are simultaneously attached to the signal-side glass substrate 102 by using an anisotropic conductive sheet or an anisotropic conductive adhesive.

Figure 12:
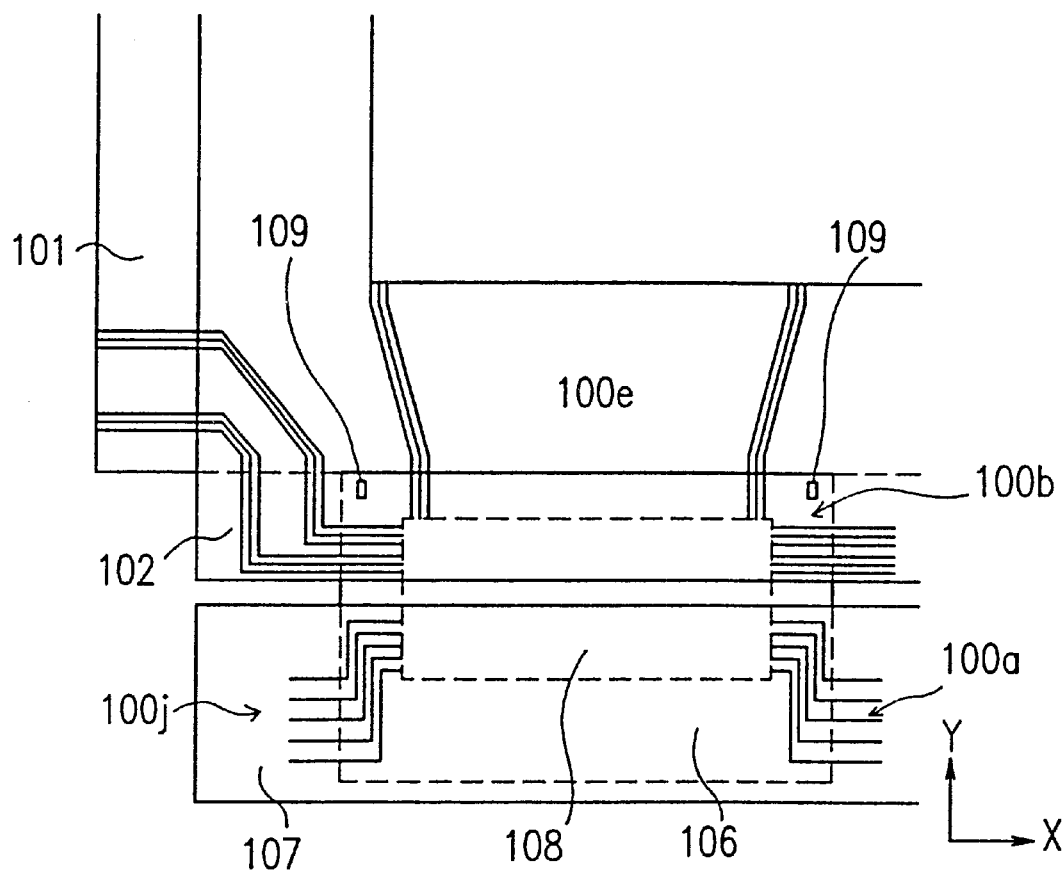
FIG. 12 is a view illustrating register marks.

As shown in FIG. 12, register marks 109 (shown in FIG. 9) are provided at the upper left end and upper right end of each flexible CB 106 in order to enhance the precision of pressure-attachment in the direction along which the display driving terminals 100f are arranged (indicated by arrow x). The register marks shown in FIG. 9 correspond to the register marks on the signal-side glass substrate 102.

Figure 11:
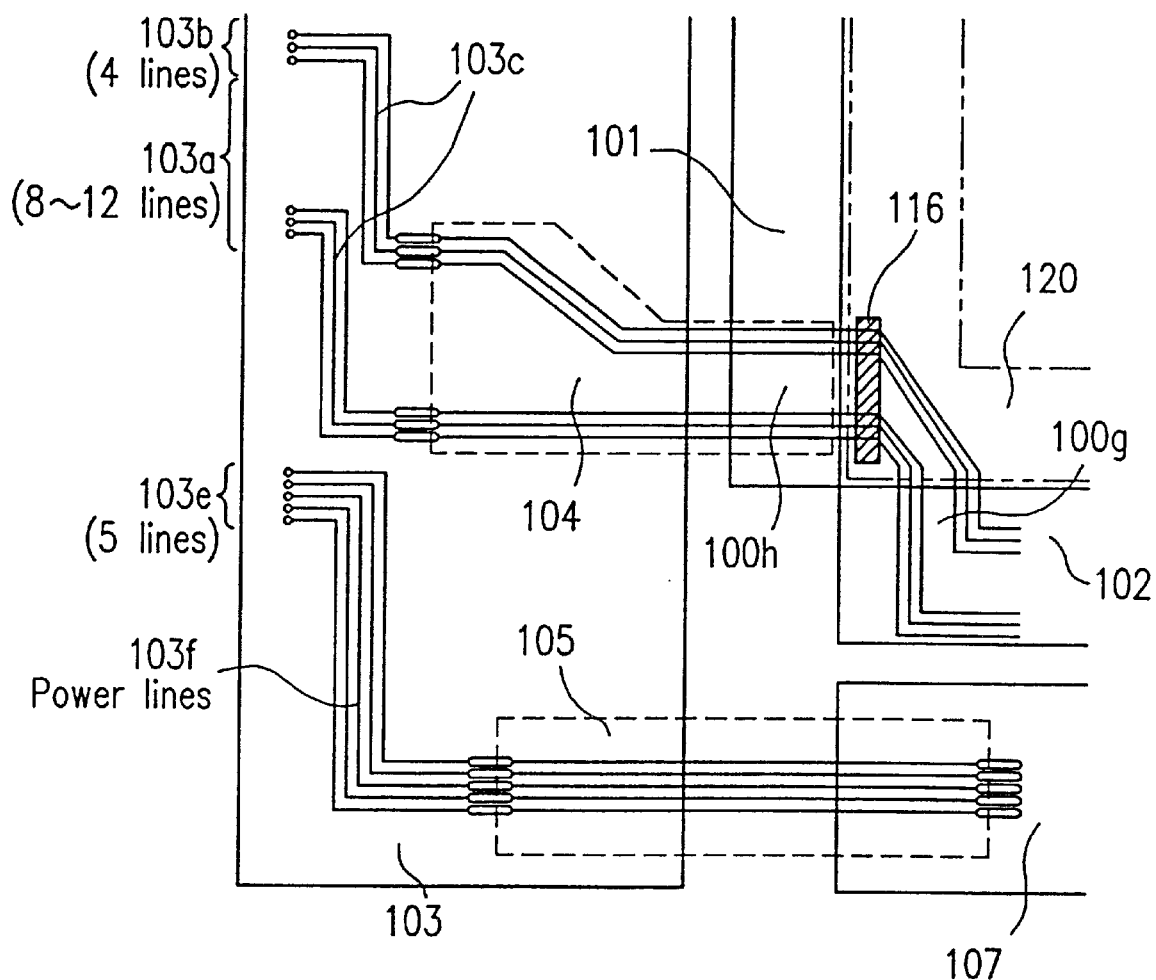
FIG. 11 illustrates an electrode transition portion formed between a scan-side glass substrate and a signal-side glass substrate.

FIG. 11 illustrates an electrode transition portion 116 formed between the scan-side glass substrate 101 and the signal-side glass substrate 102. The data signals and the control signals are supplied from the scan-side glass substrate 101 to the signal-side glass substrate 102 via the electrode transition portion 116.

Figure 13:
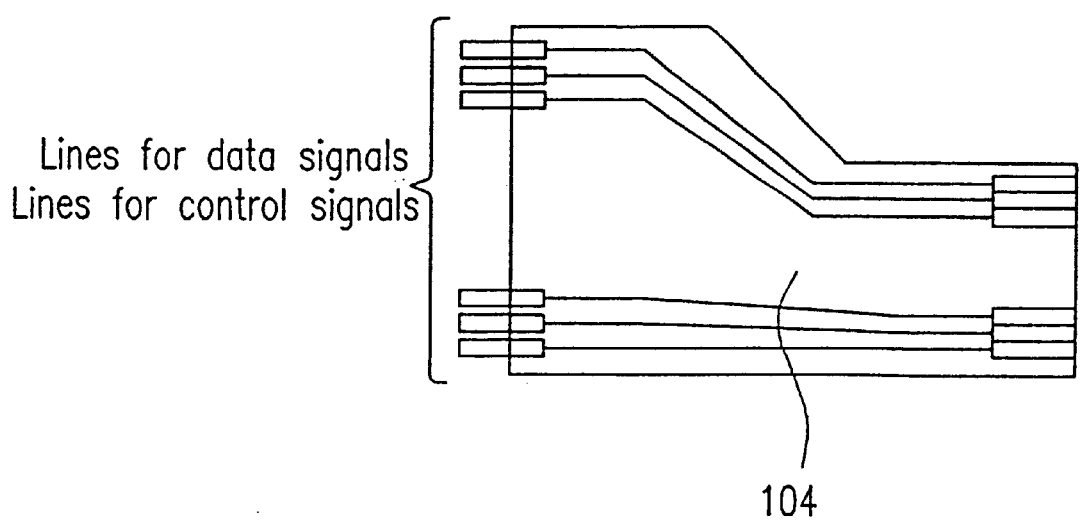
FIG. 13 is a view illustrating a detailed structure of an FPC.

In the illustrative example shown in FIG. 11, the scan-side printed CB 103 includes about 8–12 input terminals 103a for inputting data signals and about 4 input terminals 103b for inputting control signals. Printed lines 103c extend from the input terminals 103a and 103b to the junction points with the FPCs (input cable) 104. One junction point of each FPC 104 composed on a substrate of flame retardant vinyl (FIG. 13) is coupled to a scan-side printed CB 103. The other junction point of each FPC 104 is coupled to input terminals 100h for the data signal lines and control signal lines of the scan-side glass substrate 101. The detailed structure of the FPC 104 is shown in FIG. 13.

Concurrently with the formation of the data signal lines, leads 119, and the display driving terminals 100f in the display region, preferably, the input terminals 100h are also formed from the same material.

The scan-side glass substrate 101 and the FPCs 104 are attached to each other with pressure; the same goes for the scan-side printed CB 103 and the FPCs 104. The input terminals 100h for the data signal lines and control lines of the scan-side glass substrate 101 are coupled to the signal lines of the signal-side glass substrate 102 through the electrode transition portion 116 formed in a non-display region within the LC display panel, e.g., a corner of seal region 120 of the LC display panel.

Figure 14:
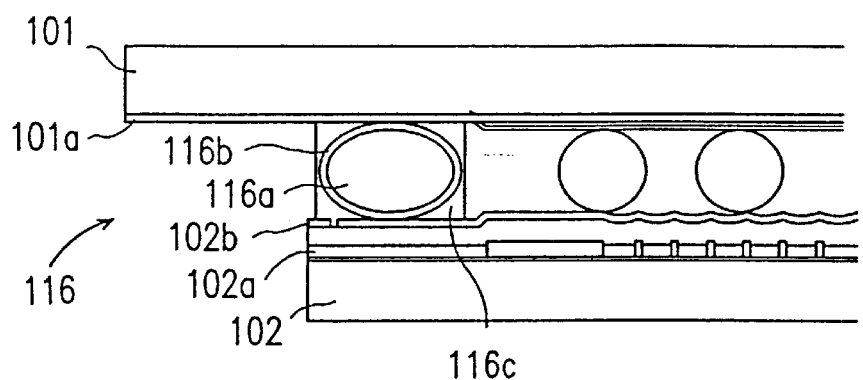
FIG. 14 is schematic cross-sectional view illustrating an electrode transition portion.

FIG. 14 schematically illustrates a cross section of the electrode transition portion 116. The electrode transition portion 116 includes scanning electrodes 101a (there is only one shown), a color filter layer 102a, signal electrodes 102b (there is only one shown), and conductive particles (there is only one shown). The color filter layer 102a is formed on the signal-side glass substrate 102.

The electrode transition portion 116 has a structure in which the scanning electrode 101a is electrically coupled to the signal electrode 102b via the conductive particle (having a diameter which is substantially equal to the thickness of the LC layer) between the scan-side electrode 101a and the signal-side electrode 102b.

The conductive particles are formed by coating a highly conductive metal layer 116b (e.g., Au) on flexible non-conductive particles 116a (e.g., plastics) by plating or like.

The conductive particles are dispersed in sealing resin 116c, so that the electrode transition portion 116 is made concurrently with the forming of the sealing resin 116c. As a result, in the seal region 120, the data-side signal lines 103a and the control signal lines 103b are appropriately coupled to corresponding lines of the scan-side glass substrate 102.

The power voltage for the driving IC 108 is supplied from the scan-side printed CB 103 to the data-side printed CB 107 via the FFC cable 105.

As shown in FIG. 11, regarding the power voltage lines of the scan-side printed CB 103, 5 parallel printed lines 103f extend from power voltage input terminals 103a to junction points with the FFC cable 105. The FFC cable 105 is coupled to the power voltage lines j. The FFC cable 105 is attached to the scan-side printed CB 103 and the data-side printed CB 107 with pressure.

Figure 15:
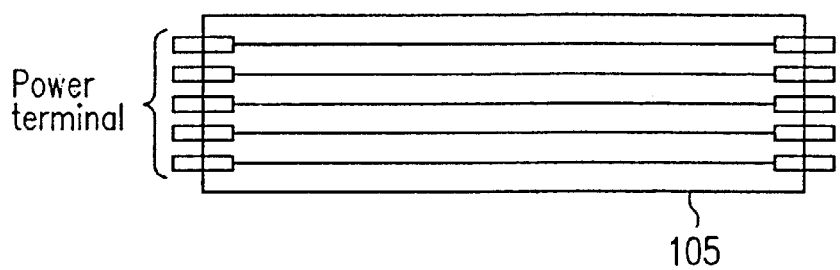
FIG. 15 is a view illustrating the details of an FFC cable.

FIG. 15 shows the details of the FFC cable 105. The FFC cable 105 is composed on a substrate of flame retardant vinyl, and has printed lines formed thereon.

According to Example 2, the data signals and/or control signals are input to the scan-side printed CB 103. The data signals and/or control signals input to the scan-side printed CB 103 are supplied to the FPCs 104 and the electrode transition portion 116. The data signals and/or control signals supplied to the signal-side glass substrate 102 are supplied to the flexible CBs 106 (with the driving ICs mounted thereon) via the signal lines 100g of the signal-side glass substrate 102.

The power voltages are supplied to the data-side printed CB 107 from the scan-side printed CB 103 via the FPC cables 105. The power voltages supplied to the data-side printed CB 107 are supplied to the flexible CBs 106.

EXAMPLE 3

FIGS. 16, 17, 18, and 19 illustrate an LC display device according to a third example of the present invention.

In the description of the present example, constituent elements which have been described with reference to the structure of Example 2 are indicated by the same numerals as used therein, the descriptions thereof omitted. At least the FPCs 104, FFC cable 105, and the electrode transition portion 116 have the same structures as their counterparts described in Example 2.

The general structure of the device of Example 3 is similar to the structure illustrated in FIG. 8.

Figure 16:
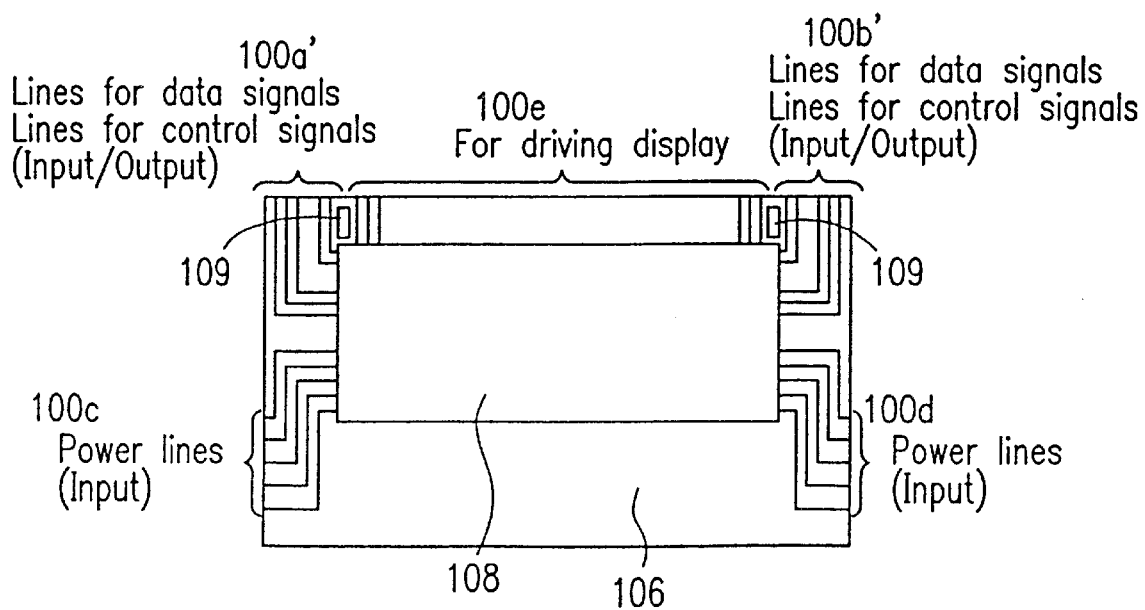
FIG. 16 is a view illustrating a flexible CB.

FIG. 16 illustrates a flexible CB 106. The flexible CB 106 includes several dozen output lines and their output terminals 100e are provided in the middle portion of the upper side of the flexible CB 106. Input/output terminals 100a' and 100b' (including about 8–12 data signal lines and about 4 control signal lines for control signals such as LP, XCK, M, DISP) are provided in the left and right ends of the upper side of the flexible CB 106, respectively. Power voltage lines (as well as input terminals coupled to the power voltage lines 100c and 100d, respectively) are provided in the lower left side and the lower right side of the flexible CB 106, respectively, as in Example 2.

Figure 17:
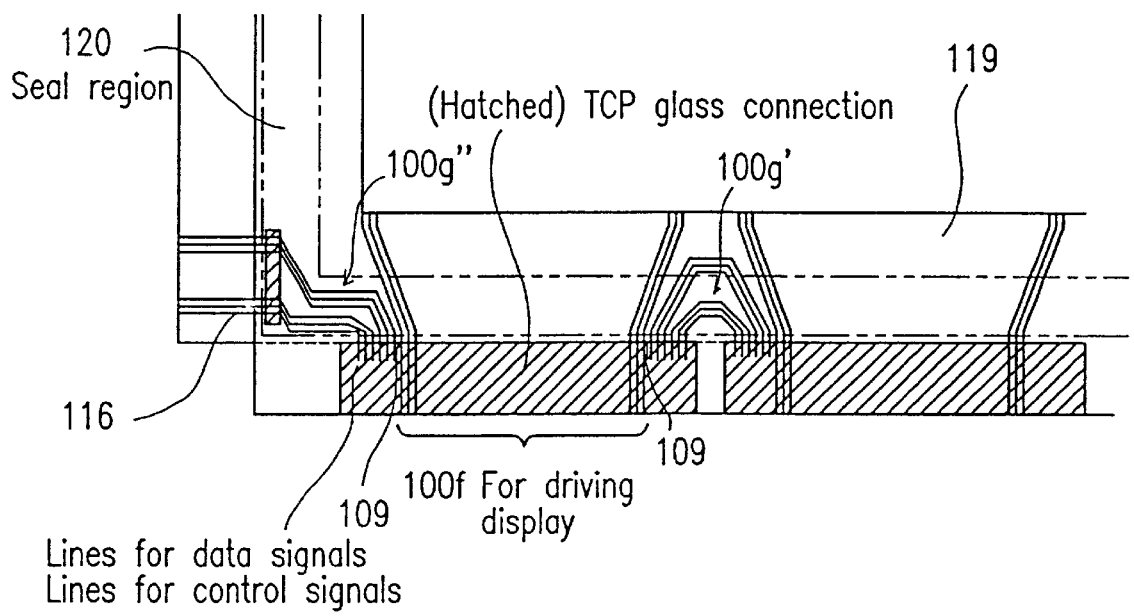
FIG. 17 is a plan view illustrating a signal-side glass substrate and a portion of a scan-side glass substrate in its vicinity.
Figure 18:
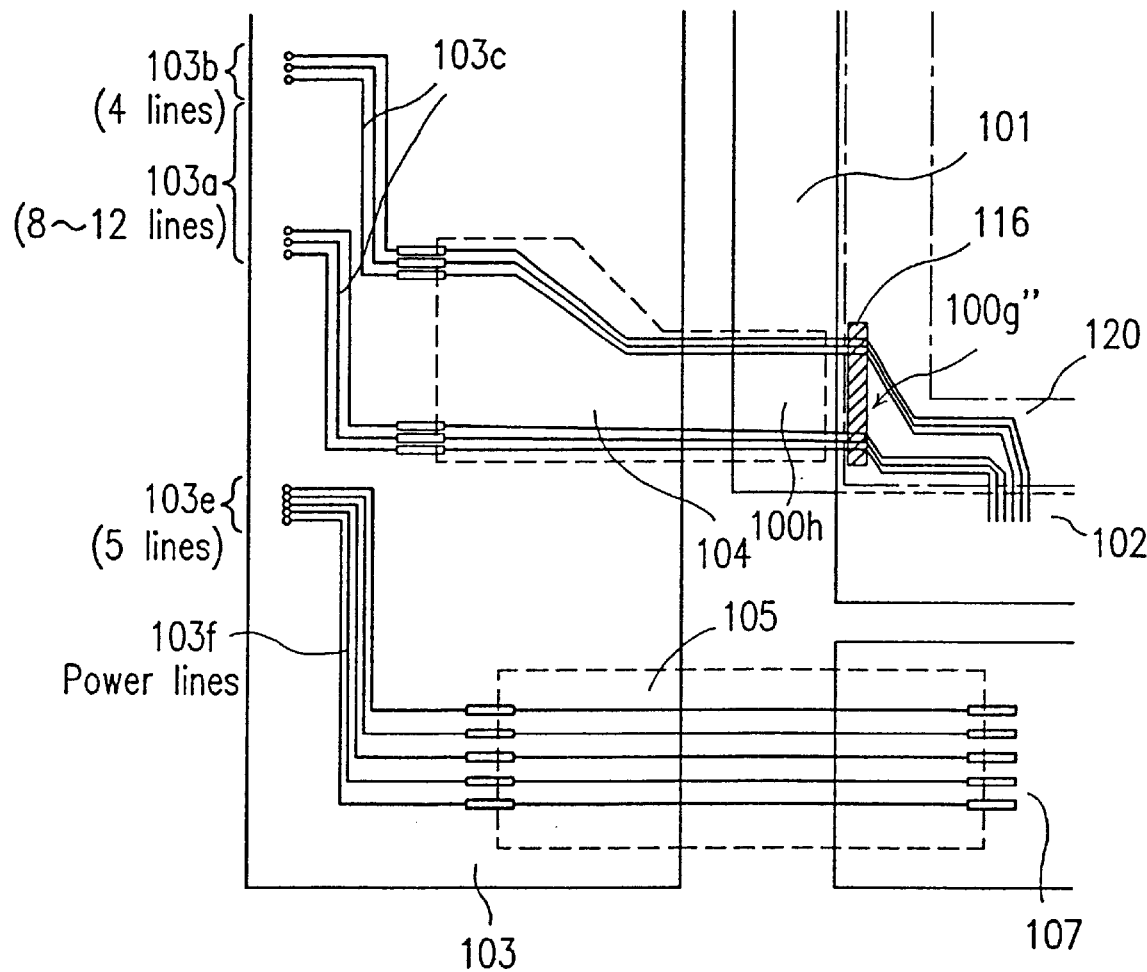
FIG. 18 is a view showing an electrode transition portion formed between a scan-side glass substrate and signal-side glass substrate.
Figure 19:
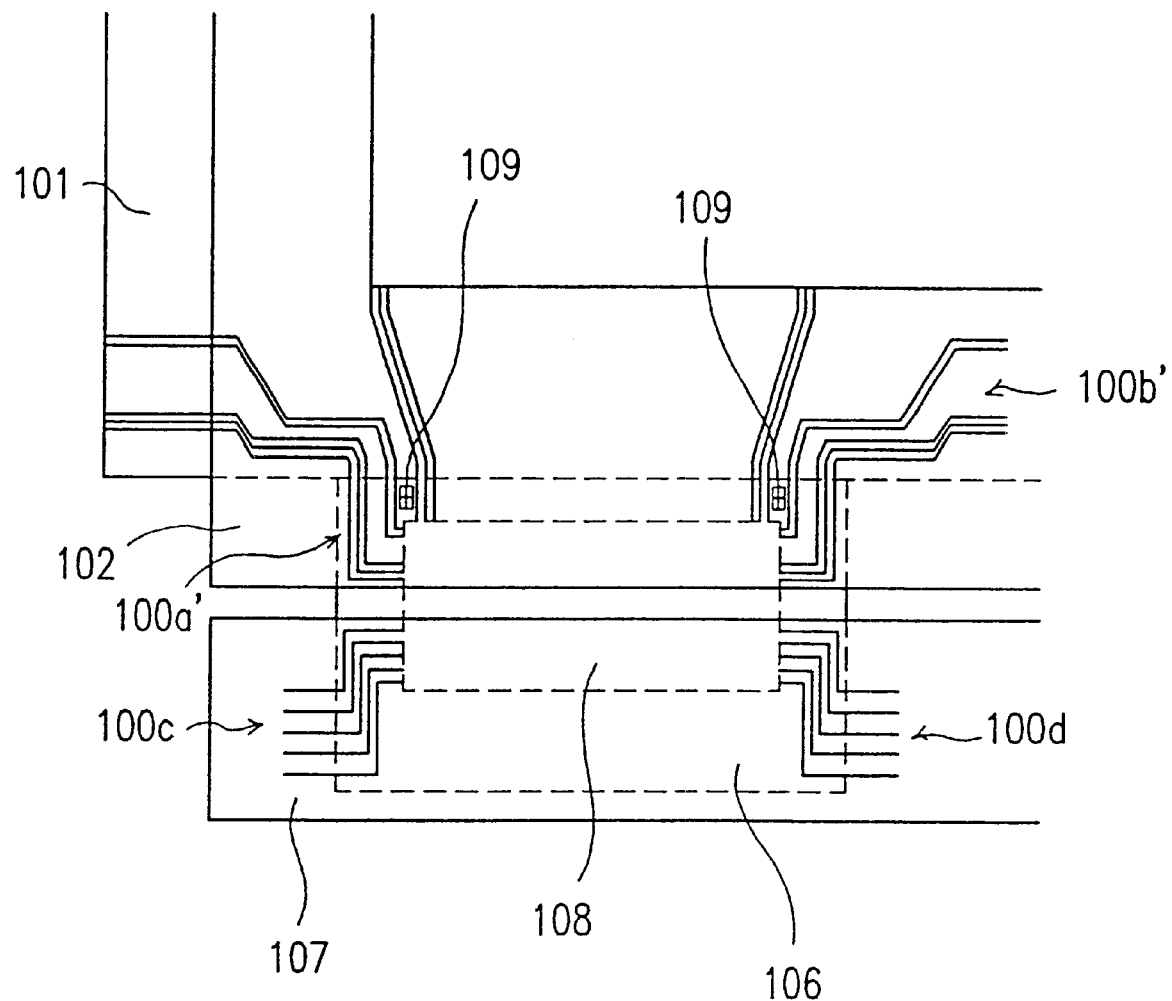
FIG. 19 is a view illustrating register marks.

FIG. 17 is a plan view illustrating a signal-side glass substrate 102 and a portion of the scan-side glass substrate 101 in its vicinity. Display driving terminals 100f, signal lines 100g', input/output terminals 100a' and 100b', and the like are formed so as to conform to the structure of the flexible CB 106 shown in FIG. 16.

Specifically, display driving terminals 100f are formed on the signal-side glass substrate 102. Signal lines 100g' to be coupled to the input/output terminals 100a and 100b of the data signal lines and control signal lines of adjoining flexible CBs 106 are formed between the display driving terminals 100f.

The signal lines 100g' extend in a U shape to a seal region. Signal lines 100g'' coupled to an electrode transition portion 116 extend the seal region.

In Examples 2 and 3, the data signals and the control signals are supplied from the scan-side glass substrate 101 to the signal-side glass substrate 102 via the electrode transition portion 116, and the power voltage lines are coupled from the scan-side printed CB 103 to the data-side printed CB 107. Alternatively, the power voltage lines may be coupled from the scan-side glass substrate 101 to the signal-side glass substrate 102 via the electrode transition portion 116, and the data signals and the control signals may be supplied from the scan-side printed CB 103 to the data-side printed CB 107.

One of the data signals and the control signals may be supplied from the scan-side glass substrate 101 to the signal-side glass substrate 102 via the electrode transition portion 116, while the other of the control signals and the data signals, in addition to the power voltages, may be supplied from the scan-side printed CB 103 to the data-side printed CB 107.

In Examples 2 and 3, as mentioned above, the data signals and the control signals are supplied from the scan-side glass substrate 101 to the signal-side glass substrate 102 via the electrode transition portion 116. Alternatively, the scanning signals may be supplied from the signal-side glass substrate 102 to the scan-side glass substrate 101 via the electrode transition portion 116.

EXAMPLE 4

Hereinafter, a fourth example of the present invention will be described with reference to the figures.

Figure 20:
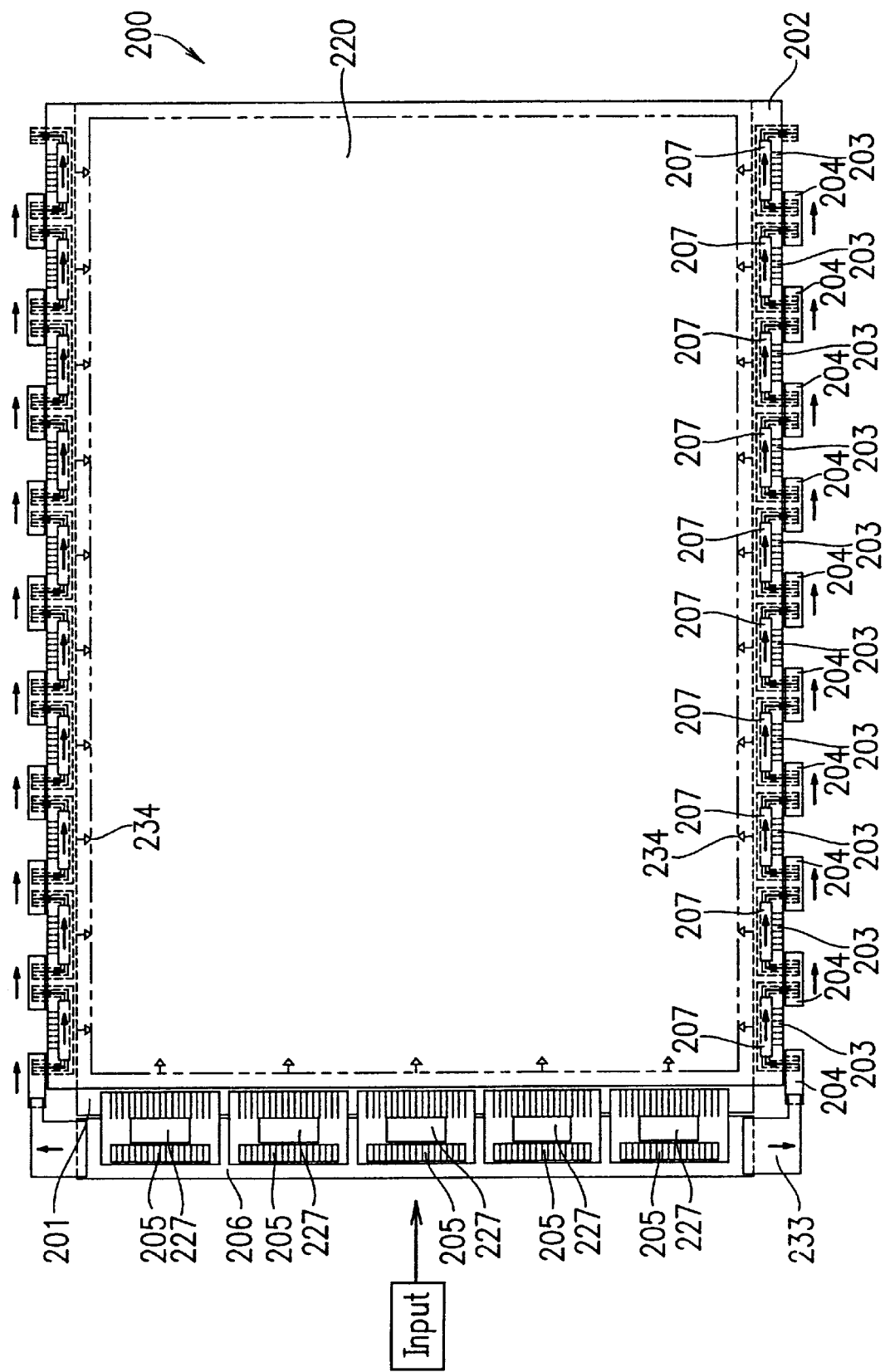
FIG. 20 is a front view of an LC display device 200 according to Example 4 of the present invention.

FIG. 20 is a front view of an LC display device 200 according to Example 4 of the present invention.

The LC display device 200 of the present example includes: an LC display panel 220 having a scan-side glass substrate 201 and a data-side glass substrate 202; a plurality of data-side flexible CBs 203; a plurality of data-side CBs 204; a plurality of scan-side flexible CBs 205; and a scan-side printed CB 206. Each data-side flexible CB 203 has a driving IC 207 provided thereon. Each scan-side flexible CB 205 has a driving IC 227 provided thereon.

The data-side glass substrate 202 of the LC display panel 220 is electrically coupled to the scan-side printed CB 206 via the scan-side flexible CBs 205. The data-side CBs 204 are electrically coupled to the data-side glass substrate 202.

In FIG. 20, arrows are shown to indicate the respective directions of flow of data-side signals. The "signals" as used herein are meant to include at least one of a data signal, a control signal, and a power signal. A signal which is output from a connector 233 is sequentially transferred to the data-side CBs 204 and the data-side flexible CBs 203.

According to the present example, a signal which is output from the data-side CB 204 is input to an adjoining data-side flexible CB 203, and a signal which is output from that data-side flexible CB 203 is input to an adjoining data-side CB 204. Thus, the data-side CBs 204 and the data-side flexible CBs 203 are coupled in series. Accordingly, it is possible to construct the data-side CBs 204 out of a single-layered substrate.

A data signal is passed down adjoining data-side flexible CBs 203 via the data-side CBs 204. The ICs 207 on the data-side flexible CBs 203 applies an appropriate signal process to the received data signal, so that a resulting display signal 234 is sent to the LC display panel 220. A scanning signal is output to the LC display panel 220 via the scan-side CB 206 and the scan-side flexible CBs 205.

The dimensions of the data-side CBs 204, which function as bridging or intermediate relaying substrates, can be prescribed as short as in the data-side flexible CBs 4 shown in FIG. 1A.

Because of the small dimensions of the data-side CBs 204, it is possible to efficiently cut out a large number of data-side CBs 204 from a single blank. Moreover, the LC display device 200 can be produced by simply setting the data-side CBs 204 on appropriate jigs and setting the LC display panel 220 (to which the data-side flexible CBs 203 are coupled) on appropriate jigs. Since these substrates only need to be machine-processed in this manner, any deterioration in the production process efficiency is prevented.

In general, the thermal expansion of a CB occurs in proportion with the dimensions of the CB. Since the data-side CBs 204 have small dimensions, the problematic warpage of the data-side CBs 204 is alleviated. Moreover, the problematic warpage of the data-side CBs 204 can be further reduced by the fact that the data-side CBs 204 can be constructed based on a single-layer structure. In contrast to this are conventional CBs which are composed of multiple layers of materials having different thermal expansion coefficients, which would invite greater warpage due to thermal expansion because of the multiple layers being attached together in a fixed manner.

In accordance with the LC display device 200 shown in FIG. 20, the connection portion (not shown) of the LC panel 220 is located relatively close to the connection portions (not shown) of the data-side CBs 204. As a result, the pressure-attachment between the data-side glass substrate 202 and the data-side flexible CBs 203 and the pressure-attachment between the data-side flexible CBs 203 and the data-side CBs 204 can be performed simultaneously. Moreover, because of the relatively small distance between the connection portion of the LC panel 220 and the connection portions of the data-side CBs 204, the LC display device 200 allows for an easy tool balance adjustment, thereby facilitating temperature adjustment with respect to tools. In contrast to this is a conventional structure in which pressure-attachment or soldering needs to be performed in dispersed positions, which would likely result in a poor press tool balance in actual implementations.

Figure 21:
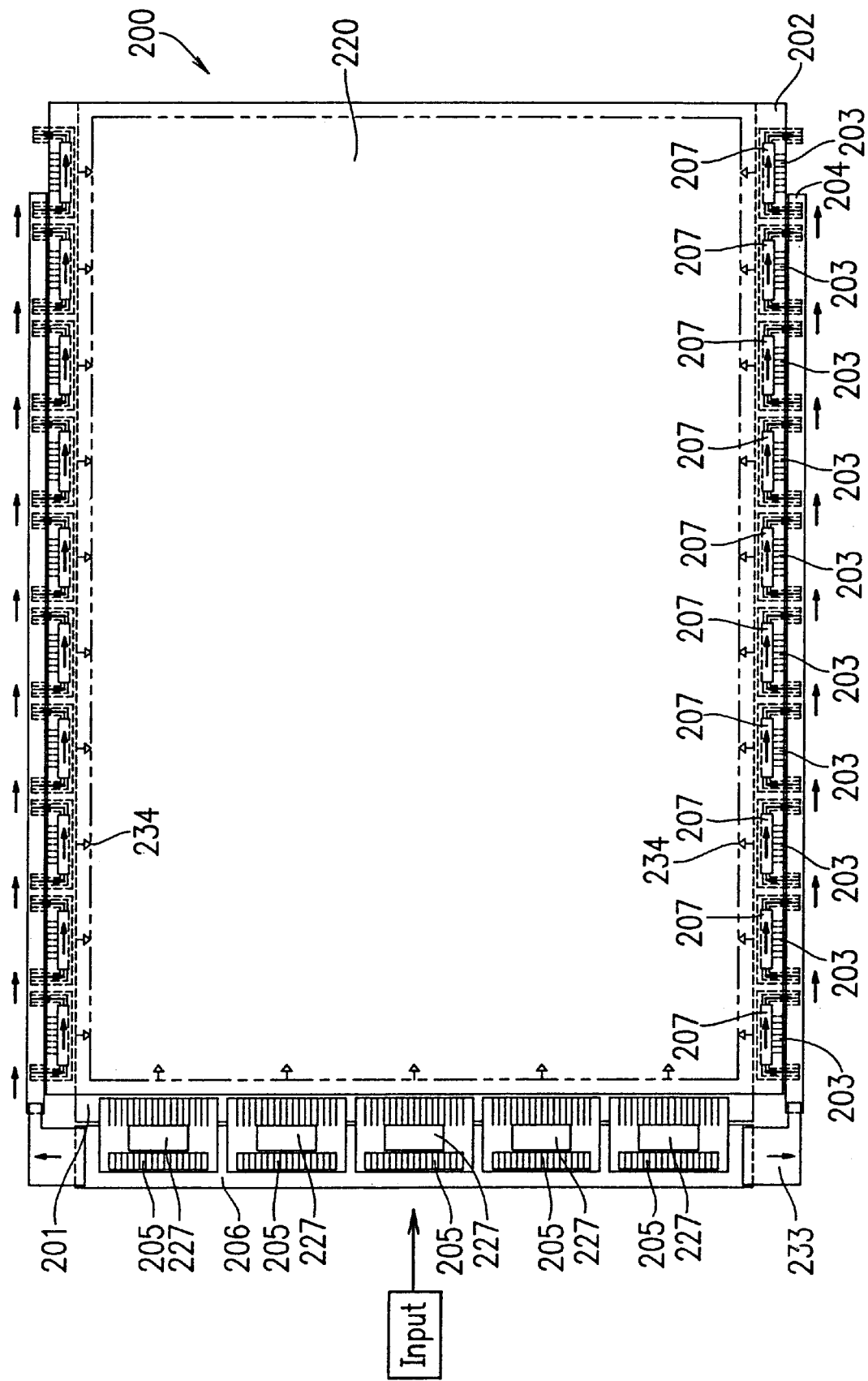
FIG. 21 is a front view of another LC display device according to Example 4 of the present invention in which a data-side CBs 204 has relatively large dimensions.

Alternatively, the data-side CBs 204 may have relatively large dimensions as illustrated in FIG. 21.

Figure 22:
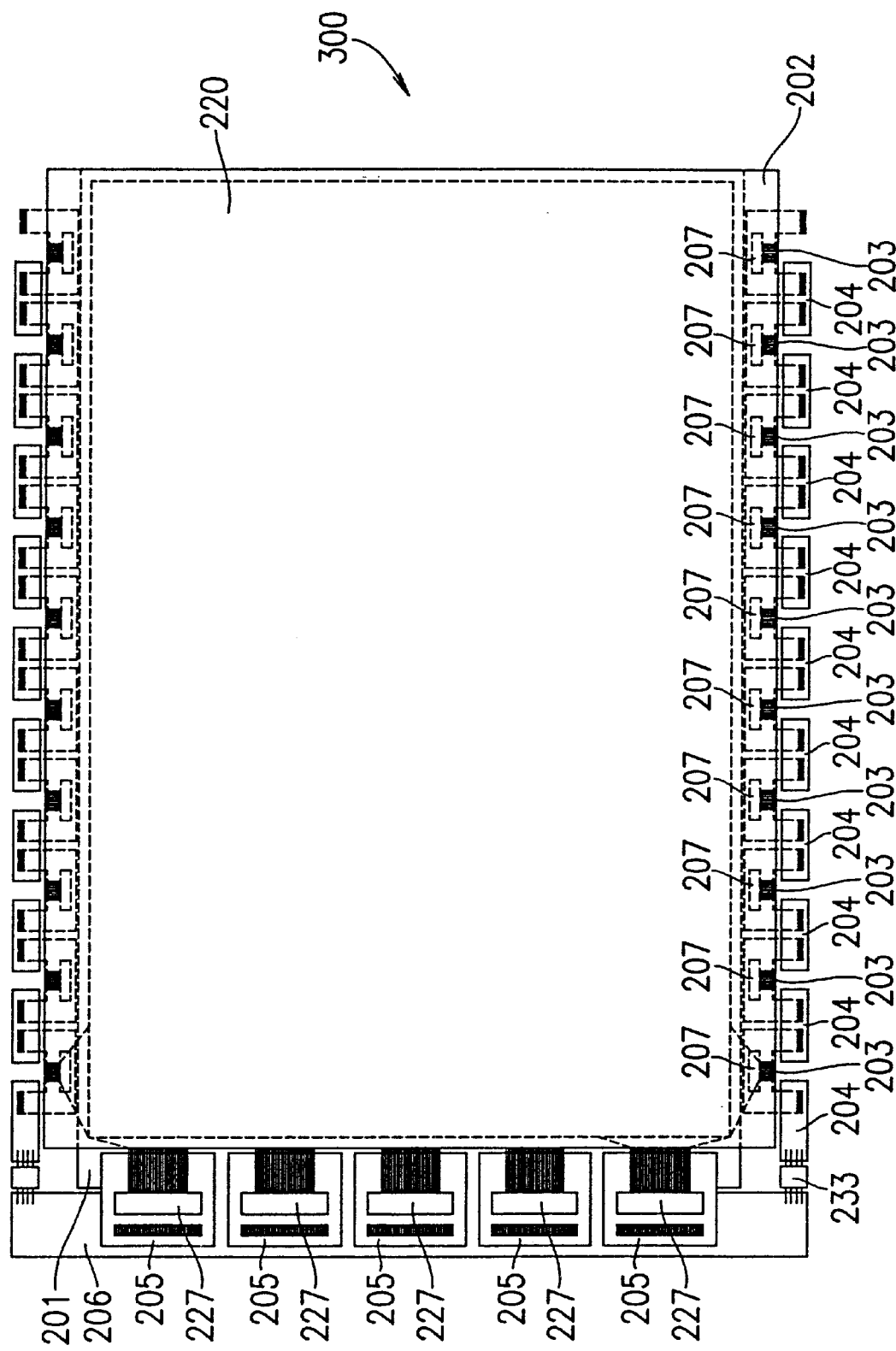
FIG. 22 is a front view of still another LC display device 300 according to Example 4 of the present invention.
Figure 23:
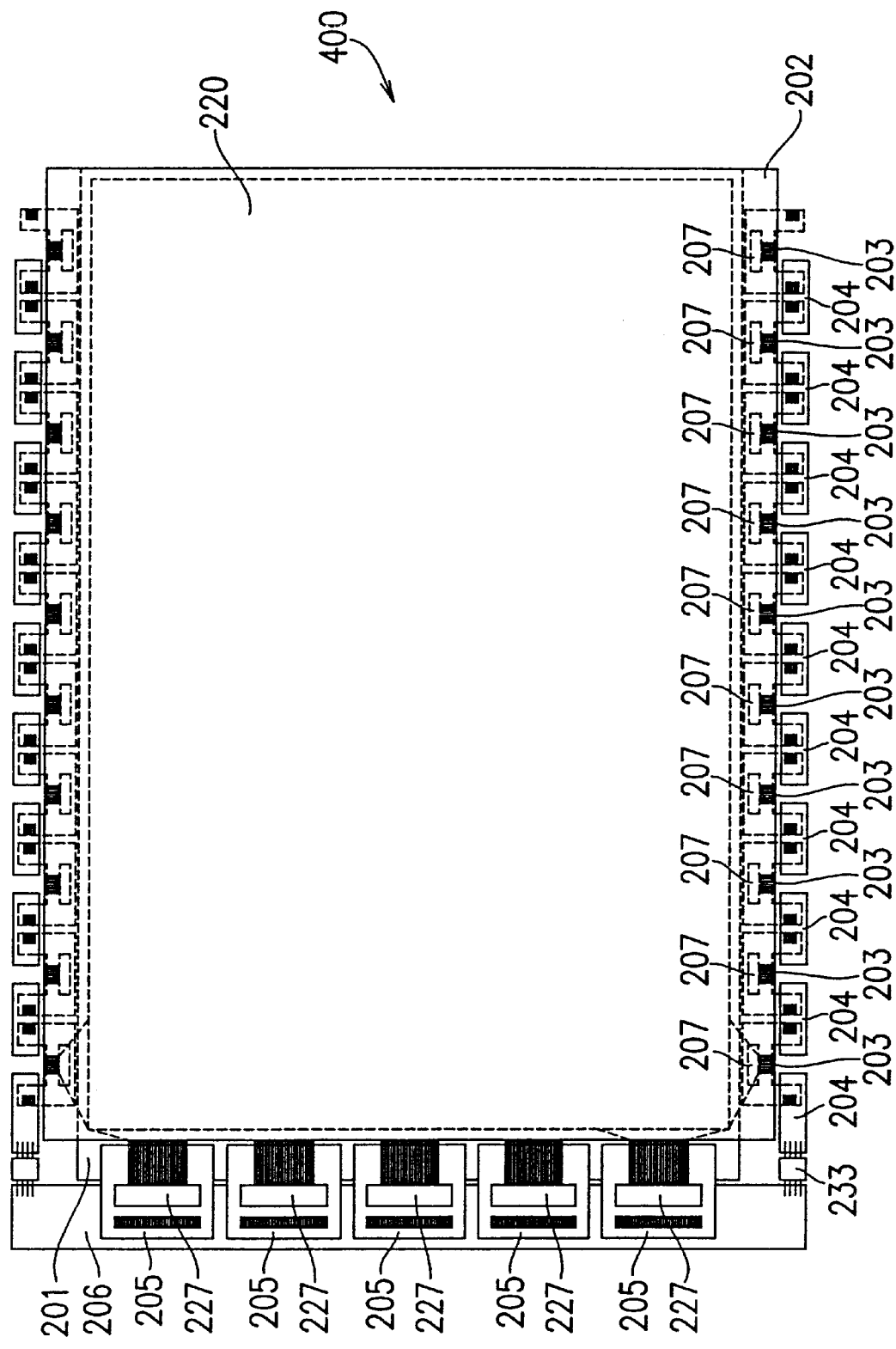
FIG. 23 is a front view of still another LC display device 400 according to Example 4 of the present invention.

FIGS. 22 and 23 respectively illustrate LC display devices 300 and 400 according to Example 4 of the present invention, with a special focus on the structure of the data-side flexible CB 203.

Figure 24A:
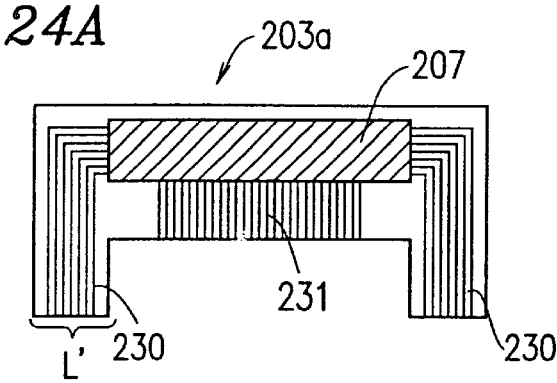
FIGS. 24A and 24B are a front view and a side view, respectively, of one embodiment of the data-side flexible CB shown in FIG. 22.
Figure 24B:
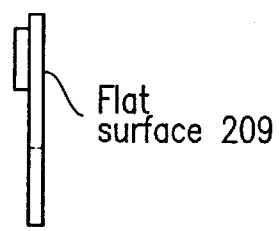

FIGS. 24A and 24B are a front view and a side view, respectively, of one embodiment of the data-side flexible CB shown in FIG. 22.

The data-side flexible CB 203a shown in FIG. 24A includes input/output terminals 230 for inputting and outputting signals, a driving IC 207 for subjecting all or a portion of the received data signal to an appropriate signal process so as to generate a display signal, and output terminals 231 for outputting the resultant display signal to the LC display panel 220.

Figure 25A:
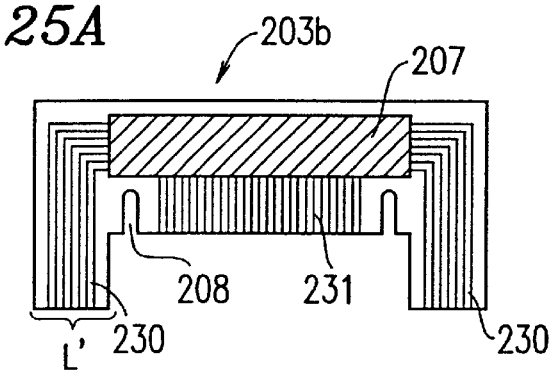
FIGS. 25A and 25B are a front view and a side view, respectively, of another embodiment of the data-side flexible CB shown in FIG. 22.
Figure 25B:
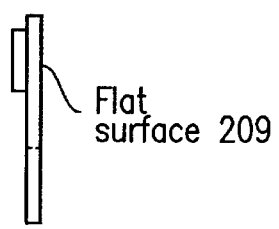

FIGS. 25A and 25B are a front view and a side view, respectively, of another embodiment of the data-side flexible CB shown in FIG. 22.

The data-side flexible CB 203b shown in FIG. 25A includes input/output terminals 230, a driving IC 207, and output terminals 231 in a manner similar to the data-side flexible CB 203a. In addition, the data-side flexible CB 203b shown in FIG. 25A includes notches 208 provided on a long side thereof, thereby making it possible to confirm the state of attachment between the data-side flexible CB 203b and the data-side glass substrate 202 (FIG. 22) by eyesight. Moreover, the notches 208 provide for better electrical isolation between the input/output terminals 230 and the output terminals 232 of the data-side flexible CB 203b.

Figure 26A:
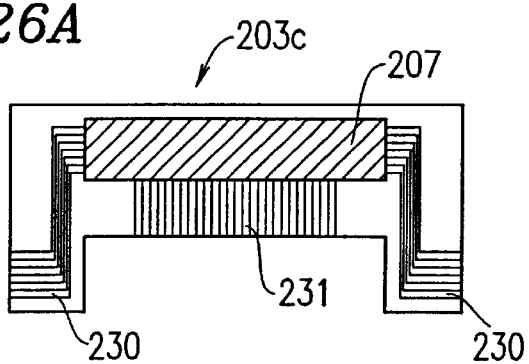
FIGS. 26A and 26B are a front view and a side view, respectively, of one embodiment of the data-side flexible CB shown in FIG. 23.
Figure 26B:
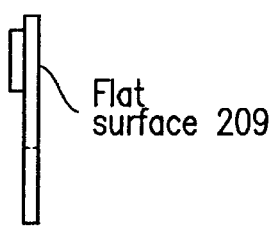

FIGS. 26A and 26B are a front view and a side view, respectively, of one embodiment of the data-side flexible CB shown in FIG. 23.

The data-side flexible CB 203c shown in FIG. 26A includes input/output terminals 230, a driving IC 207, and output terminals 231 in a manner similar to the data-side flexible CB 203a.

Figure 27A:
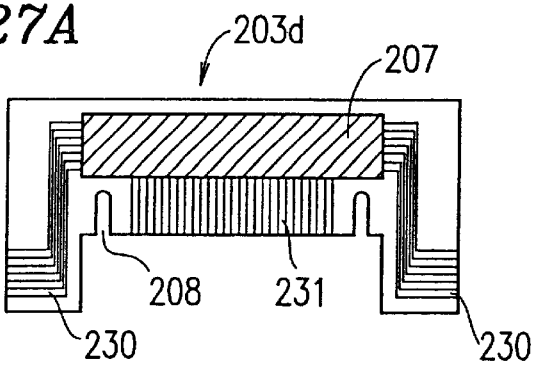
FIGS. 27A and 27B are a front view and a side view, respectively, or another embodiment of the data-side flexible CB shown in FIG. 23.

It should be noted that, whereas the input/output terminals 230 of the data-side flexible CBs 203a and 203b in FIGS. 24A and 24B are provided on portions (L') of the long sides of the respective CBs, the input/output terminals 230 shown in FIGS. 26A and 27A are provided on the short sides of the data-side flexible CBs 203c and 203d, respectively.

Figure 27B:
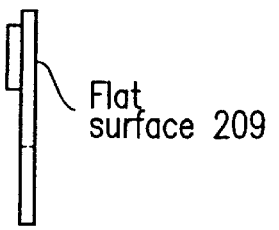

FIGS. 27A and 27B are a front view and a side view, respectively, of another embodiment of the data-side flexible CB shown in FIG. 23.

The data-side flexible CB 203d shown in FIG. 27A includes input/output terminals 230, a driving IC 207, output terminals 231, and notches 208 in a manner similar to the data-side flexible CB 203b. As a result, it is possible to confirm the state of attachment between the data-side flexible CB 203d and the data-side glass substrate 202 (FIG. 23) by eyesight. Moreover, the notches 208 provide for better electrical isolation between the input/output terminals 230 on a short side of the data-side flexible CB 203d and the output terminals 231 on a long side of the data-side flexible CB 203d.

FIG. 28 is a front view of another LC display device 500 according to Example 4 of the present invention.

The LC display device 500 includes: an LC display panel 220 having a scan-side glass substrate 201 and a data-side glass substrate 202; a plurality of data-side flexible CBs 203; a plurality of scan-side flexible CBs 205; and a scan-side printed CB 206. A driving IC 227 is provided on each scan-side flexible CB 205. A driving IC 207 is provided on each data-side flexible CB 203. It should be noted that the LC display device 500 does not require any data-side CBs.

Figure 29A:
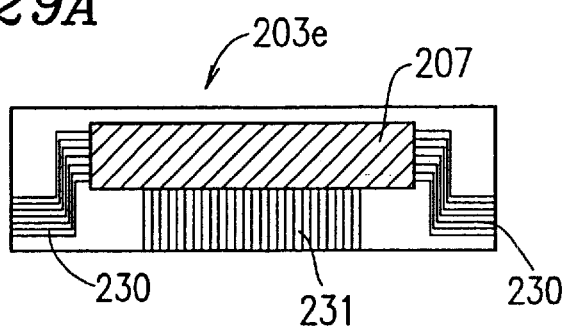
FIGS. 29A and 29B are a front view and a side view, respectively, of one embodiment of the data-side flexible CB shown in FIG. 28.
Figure 29B:
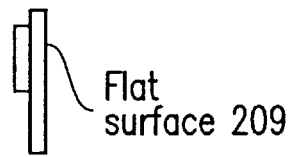

FIGS. 29A and 29B are a front view and a side view, respectively, of one embodiment of the data-side flexible CB shown in FIG. 28.

The data-side flexible CB 203e shown in FIG. 29A includes input/output terminals 230 for inputting and outputting signals, a driving IC 207 for subjecting all or a portion of the received data signals to an appropriate signal process so as to generate a display signal, and output terminals 231 for outputting the resultant display signal to an LC display panel 220.

Figure 30A:
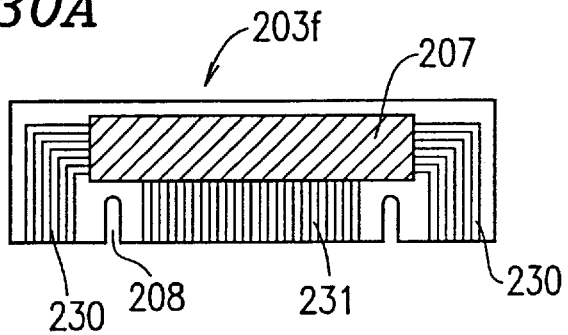
FIGS. 30A and 30B are a front view and a side view, respectively, of another embodiment of the data-side flexible CB shown in FIG. 28.
Figure 30B:
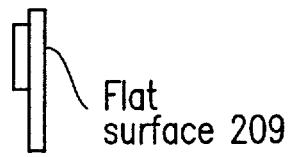

FIGS. 30A and 30B are a front view and a side view, respectively, of another embodiment of the data-side flexible CB shown in FIG. 28.

The data-side flexible CB 203f shown in FIG. 30A includes input/output terminals 230, a driving IC 207, and output terminals 231 in a manner similar to the data-side flexible CB 203e. In addition, the data-side flexible CB 203f shown in FIG. 30A includes notches 208 provided on a long side thereof, thereby making it possible to confirm the state of attachment between the data-side flexible CB 203f and the data-side glass substrate 202 (FIG. 28) by eyesight. Moreover, the notches 208 provide for better electrical isolation between the input/output terminals 230 and the output terminals 231 of the data-side flexible CB 203f.

As shown in FIGS. 24B to 27B, 29B, and 30B, it is preferable that the back face 209 of the data-side flexible CBs 203a to 203f be made flat so that the data-side flexible CBs 203a to 203f can be mounted on the data-side glass substrate 202 with improved accuracy.

Hereinafter, the relative shortness of the short sides of the data-side flexible CBs 203a to 203d shown in FIGS. 24A to 27A, as compared to that of conventional data-side flexible CBs, will be illustrated with reference to FIGS. 31A and 31B.

Figure 31A:
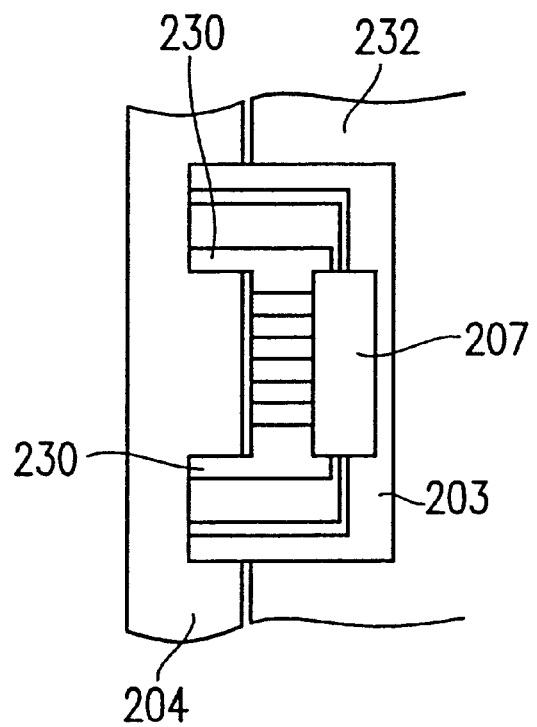
FIG. 31A is a front view showing a data-side flexible CB according to Example 4 of the invention.

FIG. 31A is a front view showing a data-side flexible CB according to the present example of the invention. FIG. 31B is a front view showing a data-side flexible CB.

Figure 31B:
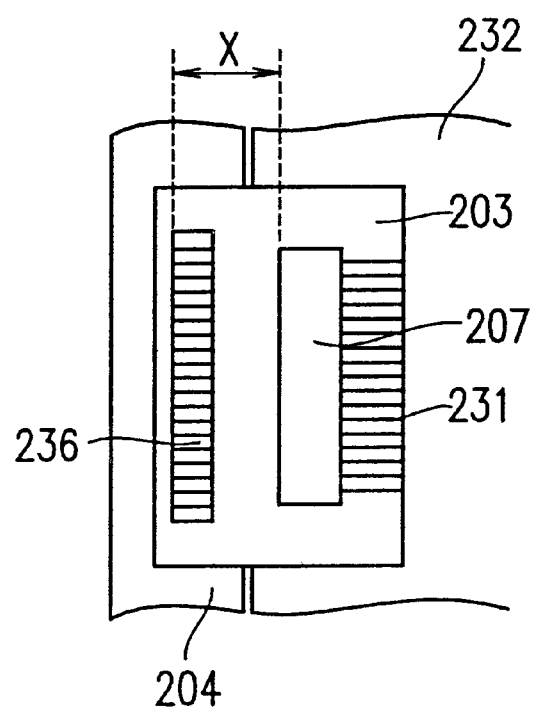
FIG. 31B is a front view showing a data-side flexible CB.

The data-side flexible CB shown in FIG. 31B is constructed so that the wiring from the driving IC 207 extends over to both long sides of the data-side flexible CB. On the other hand, as shown in FIG. 31A, the data-side flexible CB according to the present example is constructed so that the wiring from the driving IC 207 extends to only one of the long sides of the data-side flexible CB. Thus, it will be seen that the length X, which corresponds to a sum of the length of terminals 236 of the driving IC 207 and any wiring coupled to the terminals 236, is wasted in the data-side flexible CB shown in FIG. 31B.

Figure 36:
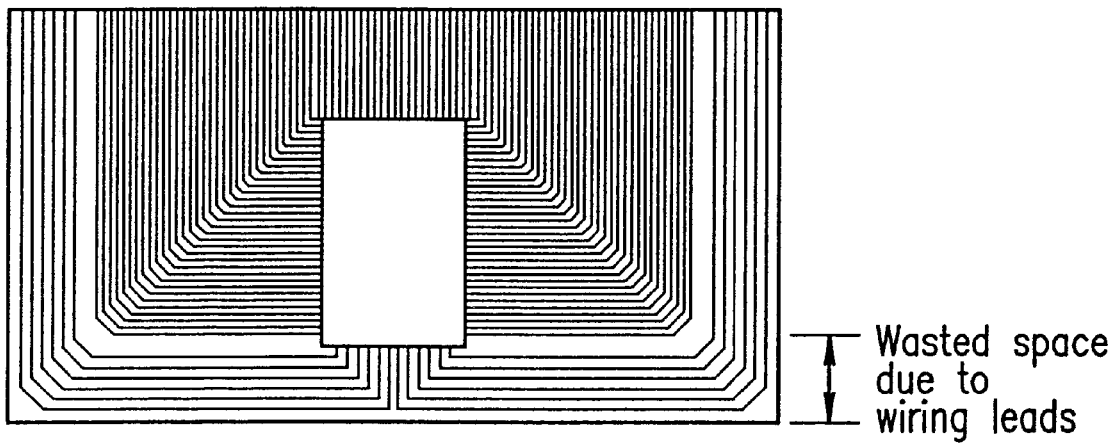
FIG. 36 is a front view showing a conventional data-side flexible CB.

Hereinafter, the relative shortness of the short sides of the data-side flexible CBs 203e and 203f shown in FIGS. 29A and 30A, as compared to that of conventional data-side flexible CBs shown in FIG. 36, will be illustrated with reference to FIGS. 32A and 32B.

Figure 32A:
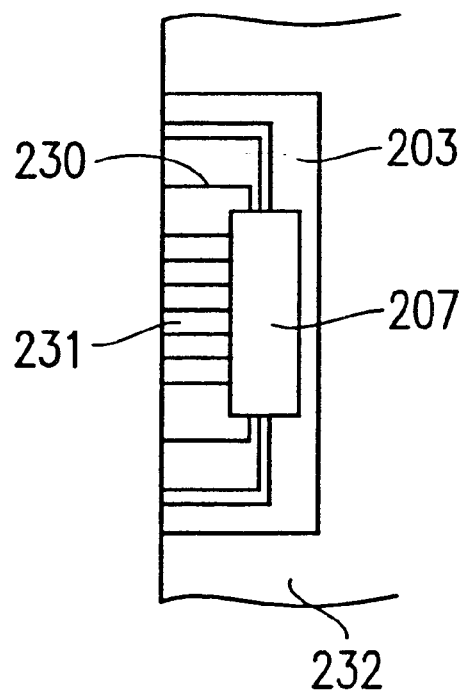
FIG. 32A is a front view showing a data-side flexible CB according to Example 4 of the invention.

FIG. 32A is a front view showing a data-side flexible CB according to the present example of the invention. FIG. 32B is a front view showing a conventional data-side flexible CB shown in FIG. 36.

Figure 32B:
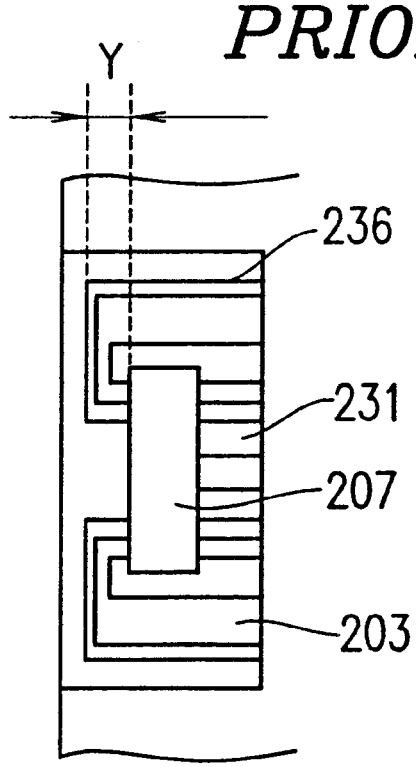
FIG. 32B is a front view showing a conventional data-side flexible CB.

As shown in FIG. 32B, the conventional data-side flexible CB is constructed so that the wiring from the driving IC 207 extends to both long sides of the data-side flexible CB. On the other hand, as shown in FIG. 32A, the data-side flexible CB according to the present example is constructed so that the wiring from the driving IC 207 extends over to only one of the long sides of the data-side flexible CB. Thus, it will be seen that the length Y, which corresponds to a sum of the length of the terminals of the driving IC 207 and any wiring coupled to the terminals, is wasted in the conventional data-side flexible CB shown in FIGS. 32B and 36.

Hereinafter, input terminals 241 and wiring leads 242 on the data-side glass substrate 202 according to the present example will be described with reference to FIGS. 33 and 34.

Figure 33:
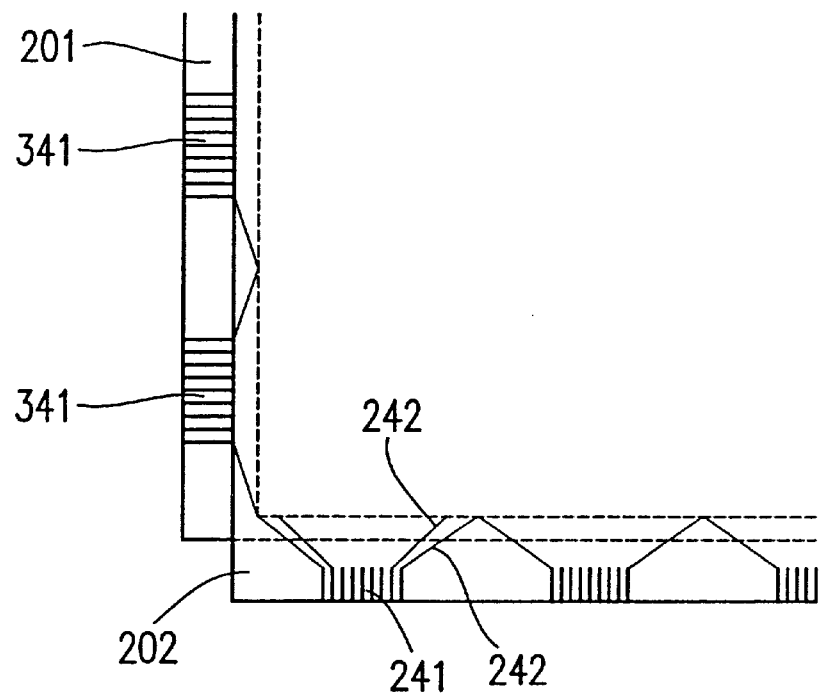
FIG. 33 is a front view illustrating input terminals 241 and wiring leads 242 on a data-side glass substrate 202 according to the present invention.

FIG. 33 is a front view illustrating the input terminals 241 and the wiring leads 242 on the data-side glass substrate 202 according to the present example. FIG. 34 is a front view illustrating the data-side glass substrate 202 with the scan-side flexible CBs 205, the scan-side printed CB 206, and the data-side flexible CBs 203 attached thereon.

The input terminals 241 and the wiring leads 242 are provided in the form of glass electrodes exposed on the data-side glass substrate 202. The input terminals 241 on the data-side glass substrate 202 are to be coupled to the output terminals 231 of the data-side flexible CBs 203. Since the wiring leads 242 are exposed at the end of the data-side glass substrate 202, it is preferable to provide a top coating (TC) on the surface of the data-side glass 202 in order to prevent any leakage between leads.

Figure 34:
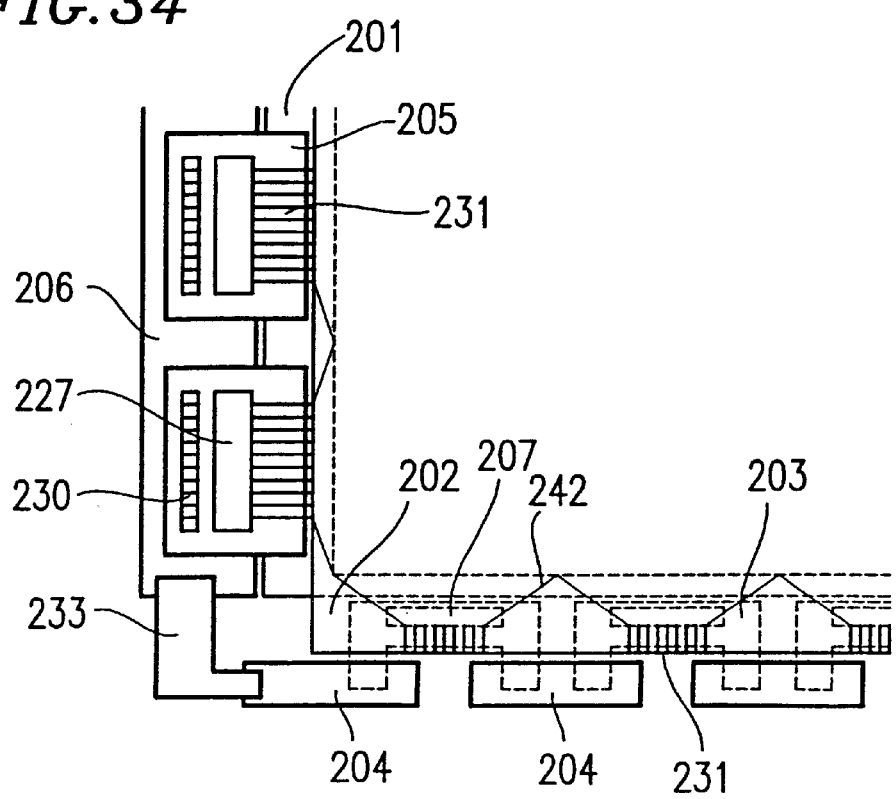
FIG. 34 is a front view illustrating the data-side glass substrate 202 with scan-side flexible CBs 205, a scan-side printed CB 206, and data-side flexible CBs 203 attached thereon.

As shown in FIG. 34, the wiring leads 242 on the data-side glass substrate 202 originate from under the edge (corresponding to the dot-and-dash line 8 shown in FIG. 35) of the driving IC 207 facing closer to the data-side CBs 204, and extend under the driving IC 207 so as to reach the display section of the LC display panel 220. In other words, the input terminals 241, which make electrical connection with the output terminals 231 of the data-side flexible CBs 203 near the edge of the data-side glass substrate 202, are relayed to the wiring leads 242 at a point (corresponding to the dot-and-dash line Z shown in FIG. 35) where they electrically connect to the driving IC 207.

Figure 35:
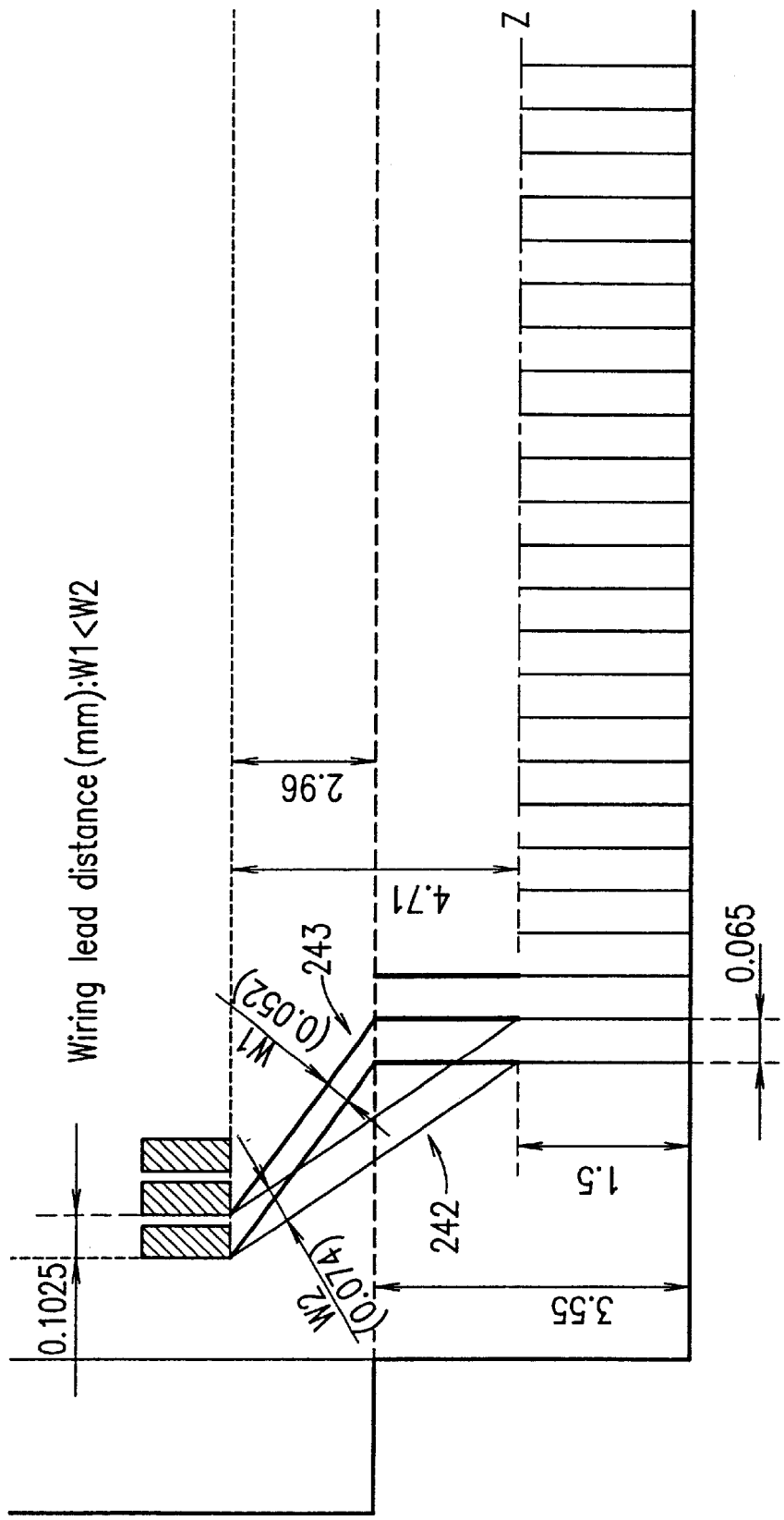
FIG. 35 illustrates conventional wiring leads 243 and the wiring leads 242 according to the present invention.

FIG. 35 comparatively illustrates conventional wiring leads 243 and the wiring leads 242 according to the present invention. As shown in FIG. 35, the conventional wiring leads 243 are spaced apart by a distance W1 (=about 0.052 mm) from one another, whereas the wiring leads 242 according to the invention are spaced apart by a distance W2 (=about 0.074 mm) from one another. Thus, W1<W2, with a difference of about 0.022 mm. As a result, the present invention provides more flexibility insofar as wiring leads are concerned.

In accordance with the data-side flexible CB of the present example, the input section and the output section of the input/output terminals can be exchanged by means of setting terminals on the printed CBs. Therefore, the data-side flexible CBs 203 may be mounted so as to be upside-down or so that their right sides and left sides are reversed.

Hereinafter, the pressure-attachment process for the LC display device according to the present example will be described.

An anisotropic conductive film (not shown) is attached on the LC display panel 220 for temporary fixation. The data glass substrate 202 and the data-side flexible CBs 203 are positioned in such a manner that the input terminals 241 on the data glass substrate 202 correspond to the respective input terminals 231 on the data-side flexible CBs 203. Then, the data glass substrate 202 and the data-side flexible CBs 203 are temporarily press-attached to each other via the anisotropic conductive film.

The data-side flexible CBs 203 and the data-side CBs 204 are positioned in such a manner that the input/output terminals 230 on the data-side flexible CBs 203 correspond to the respective connection terminals on the data-side CBs 204 on which the anisotropic conductive film is provided. Then, the data-side flexible CBs 203 and the data-side CBs 204 are temporarily press-attached to each other via the anisotropic conductive film.

In the case where the data-side CBs 204 are of relatively short dimensions, a plurality of data-side CBs 204 and a plurality of data-side flexible CBs 203 may be temporarily fixed. A plurality of data-side CBs 204 are fitted into jigs which are molded in the shape of the data-side CBs 204, and the data-side flexible CBs 203 and the data-side CBs 204 are temporarily attached to one another by means of a double-sided adhesive or the like for positioning. In the case where the data-side CBs 204 (which serve as bridging circuit boards) are of relatively long dimensions, the data-side CBs 204 may be set in appropriate jigs so as to be temporarily fixed by means of a double-sided adhesive or the like.

Thereafter, the final pressure-attachment between the data-side glass substrate 202 and the data-side flexible CBs 203 and the final pressure-attachment between the data-side flexible CBs 203 and the data-side CBs 204 are effected through one step.

The aforementioned process can be made smoother by attaching an anisotropic conductive film on the data-side CBs 204 prior to the process.

According to the present example, output terminals (for outputting a signal from a driving IC to a display section) of a data-side flexible CB can be connected to electrode terminals of an LC display panel in such a manner that the output terminals of the data-side flexible CB are located towards the outer periphery of the display section with respect to the driving IC. As a result, a substantial connection margin can be provided, and the frame-like peripheral region of the LC display device can be effectively narrowed.

The production of the LC display device of the present example can be achieved with the use of press tools of a relatively broad design, which provides for better thermal conduction within the tool. It is also possible to use inexpensive press tools.

Since a large distance can be provided between the polarizing plates and the press-attached portion on the LC display surface according to the present example, it is possible to reduce the effects of heat on the polarizing plates during a pressure-attachment process.

Since the connection positions on the electrodes of the LC display panel and the connection positions on the respective circuit boards are located in close proximity according to the present example, it is possible to effect a final pressure-attachment through only one step.

As for the wiring on the glass electrodes, greater design margin can be provided between wiring leads than is possible by the aforementioned conventional techniques. As a result, it is possible to produce an LC display panel with a higher resolution.

The glass edges which appear on the electrodes of a conventional glass substrate are typically beveled so as to prevent such glass edges from accidentally cutting the wiring pattern on the flexible CBs. On the other hand, according to the present invention, the data-side flexible CBs can be positioned to a display panel so that their essential portion lies on the display panel (i.e., away from the outer periphery of the display panel). Since the wiring pattern of the flexible CBs do not overly the edge portion of the display panel, the wiring pattern is prevented from being accidentally cut by the glass edges which may appear on the electrodes of the glass substrate. Since the data-side flexible CBs can be press-attached to the glass substrate near its edges, it is possible to secure a broad connection (press-attachment) region. This substantially reduces the influences on the flexible CBs such as unwanted stress, so that disruptions of any connection in the vicinity of the output terminals can be prevented.

As described above, the flexible CB according to one embodiment of the present invention includes input terminals for receiving data signals and control signals (to be sent to a driving IC); first output terminals for outputting the signals from the driving IC; second output terminals for outputting all or some of the data signals and control signals are provided in one line along one of a pair of long sides of the flexible CB. As a result, the frame-like peripheral region of a data-side glass substrate for coupling the flexible CB and the data-side glass substrate can be made narrow.

The flexible CB according to another embodiment of the present invention includes first output terminals for outputting signals from the driving IC, and second output terminals for outputting the signals for use on the data-side flexible CB, the first and second output terminals being provided along one of a pair of long sides of the flexible CB. As a result, the frame-like peripheral region of a data-side glass substrate for coupling the flexible CB with the data-side glass substrate can be made narrow.

A liquid crystal display device according to the present invention includes: a liquid crystal display panel having a display section including a plurality of signal electrodes and a plurality of opposing scanning electrodes so that the plurality of signal electrodes and the plurality of opposing scanning electrodes together compose a matrix; at least one data-side flexible circuit board, each including a driving IC for generating a scanning signal as well as an output terminal, provided on one face of the data-side flexible circuit board, for supplying the display signal to the plurality of signal electrodes; and a scan-side flexible circuit board for supplying a scanning signal for the plurality of scanning electrodes. The driving IC is located between the display section and the output terminal of the at least one data-side flexible circuit board.

As a result, data-side flexible CBs can be connected to an LC display panel in such a manner that the output terminals of the data-side flexible CB are located towards the outer periphery of the display section with respect to the driving IC. Consequently, the data-side flexible CBs can be connected to the LC display panel so as to be located farther inward of (i.e., away from the outer periphery of) the LCD display panel, so that the frame-like peripheral region of the LC display device can be effectively narrowed.

According to the present invention, data signals and/or control signals are supplied from a scan-side glass substrate to a signal-side glass substrate via an electrode transition portion. As a result, the data signals and/or control signals are transmitted via the scan-side glass substrate and the signal-side glass substrate, thereby making it possible to effectively utilize any redundant regions on these substrates. Thus, the frame-like peripheral region of the LC display device can be narrowed. Since the power voltages are supplied via the power voltage lines on the data-side printed CB, it is possible to simplify the structure of the data-side printed CB. This also contributes to narrowing the frame-like peripheral region of the LC display device.

Various other modifications will be apparent to and can be readily made by those skilled in the art without departing from the scope and spirit of this invention. Accordingly, it is not intended that the scope of the claims appended hereto be limited to the description as set forth herein, but rather that the claims broadly construed.

What is claimed is:

1. A liquid crystal display device comprising:
   a scan-side glass substrate;
   a data-side glass substrate opposing the scan-side glass substrate;
   liquid crystal interposed between the scan-side glass substrate and the data-side glass substrate;
   a scan-side flexible circuit board electrically coupling a scan-side printed circuit board and the data-side glass substrate;
   an electrode transition portion provided between the scan-side glass substrate and the data-side glass substrate and the data-side glass substrate for transmitting a scanning signal output from the data-side glass substrate to the scan-side glass substrate; and
   data signal lines, control signal lines and power signal lines provided on the data-side glass substrate.

2. A liquid crystal display device comprising:
   a data-side flexible circuit board comprising:
     a first insulative tape having a pair of long sides and a pair of short sides;
     a first driving IC mounted on the first insulative tape;
     a first input terminal for receiving data signals and control signals to be sent to the first driving IC;
     a first output terminal for outputting a signal from the first driving IC;
     a second output terminal for outputting at least some of the data signals and control signals;
     and first and second power signal terminals for supplying a voltage to the first driving IC,
     wherein the first input terminal, the first output terminal, and the second output terminal are provided on one of the pair of long sides of the first insulative tape, the first power signal terminal being provided on one of the pair of short sides of the first insulative tape, and the second power signal terminal being provided on the other one of the pair of short sides of the first insulative tape;
   a scan-side flexible circuit board comprising:
     a second insulative tape having a pair of long sides and a pair of short sides;
     a second driving IC mounted on the second insulative tape;
     a second input terminal for receiving a signal used on the data-side flexible circuit board;
     a third output terminal for outputting a signal from the second driving IC;
     a fourth output terminal for outputting the signal used on the data-side flexible circuit board,
     wherein the third output terminal and the fourth output terminal are provided on one of the pair of long sides of the second insulative tape, the second input terminal being provided on at least one of the other one of the pair of long sides of the second insulative tape and inside the second insulative tape;
   a data-side glass substrate coupled to the data-side flexible circuit board and the scan-side flexible circuit board;
   a scan-side glass substrate opposing the data-side glass substrate;
   liquid crystal interposed between the scan-side glass substrate and the data-side glass substrate;
   an electrode transition portion provided between the scan-side glass substrate and the data-side glass substrate for transmitting a scanning signal output from the data-side glass substrate to the scan-side glass substrate; and
   data signal lines, control signal lines, and power signal lines provided on the data-side glass substrate.

3. A liquid crystal display device comprising:
   a liquid crystal display panel having a display section, the display section including a plurality of signal electrodes and a plurality of opposing scanning electrodes so that the plurality of signal electrodes and the plurality of opposing scanning electrodes together compose a matrix;
   at least one data-side flexible circuit board, each including:
     a driving IC for generating a scanning signal; and
     an output terminal for supplying the display signal to the plurality of signal electrodes; and
   a scan-side flexible circuit board for supplying a scanning signal for the plurality of scanning electrodes, wherein the driving IC is located between the display section and the output terminal of the at least one data-side flexible circuit board.

4. A liquid crystal display device according to claim 3, wherein the output terminal is provided on one face of the at least one data-side flexible circuit board, and wherein the at least one data-side flexible circuit board further includes, on the face on which the output terminal is provided, input/output terminals for inputting or outputting a signal to or from the driving IC.

5. A liquid crystal display device according to claim 3, wherein the at least one data-side flexible circuit board further includes input/output terminals for inputting or outputting a signal to or from the driving IC, and wherein the output terminal of the at least one data-side flexible circuit board is located in a region surrounded by the input/output terminals and the driving IC.

6. A liquid crystal display device according to claim 3, wherein the at least one data-side flexible circuit board includes notches at a side along which the output terminal is provided.

7. A liquid crystal display device according to claim 3, wherein the driving IC on the at least one data-side flexible circuit board is coated with resin so that the resin does not substantially project from the surface of an insulation film provided on a back face of the data-side flexible circuit board.

8. A liquid crystal display device according to claim 3, wherein an input terminal inputting a signal to the liquid crystal display panel and a portion of a wiring lead coupled to the input terminal are provided on the liquid crystal display panel.

9. A liquid crystal display device according to claim 3, wherein adjoining ones of the at least one data-side flexible circuit board are interconnected via a bridging circuit board.

* * * * *